United States Patent
Yang et al.

(10) Patent No.: US 8,423,860 B2
(45) Date of Patent: Apr. 16, 2013

(54) APPARATUS AND METHOD FOR GENERATING A PARITY CHECK MATRIX IN A COMMUNICATION SYSTEM USING LINEAR BLOCK CODES, AND A TRANSMISSION/RECEPTION APPARATUS AND METHOD USING THE SAME

(75) Inventors: Hyun-Koo Yang, Seoul (KR); Hong-Sil Jeong, Seoul (KR); Sung-Ryul Yun, Suwon-si (KR); Jae-Yoel Kim, Suwon-si (KR); Hak-Ju Lee, Incheon (KR); Seho Myung, Suwon-si (KR); Jin-Hee Jeong, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 354 days.

(21) Appl. No.: 12/917,944

(22) Filed: Nov. 2, 2010

(65) Prior Publication Data

US 2011/0107173 A1   May 5, 2011

(30) Foreign Application Priority Data

| Nov. 2, 2009 | (KR) | 10-2009-0105092 |
| Mar. 26, 2010 | (KR) | 10-2010-0027322 |
| Jun. 9, 2010 | (KR) | 10-2010-0054388 |
| Aug. 24, 2010 | (KR) | 10-2010-0082182 |

(51) Int. Cl.
*G06F 11/00* (2006.01)
(52) U.S. Cl.
USPC .......................................... 714/752; 714/759
(58) Field of Classification Search .................. 714/752, 714/755, 759, 786, 800
See application file for complete search history.

(56) References Cited

U.S. PATENT DOCUMENTS

| 2003/0037298 A1* | 2/2003 | Eleftheriou et al. ......... 714/752 |
| 2004/0054960 A1 | 3/2004 | Eroz et al. |
| 2004/0221223 A1 | 11/2004 | Yu et al. |
| 2009/0063926 A1 | 3/2009 | Cho et al. |
| 2009/0089642 A1 | 4/2009 | Miles et al. |
| 2009/0210767 A1* | 8/2009 | Myung et al. ................. 714/752 |
| 2010/0229066 A1 | 9/2010 | Matsumoto et al. |

FOREIGN PATENT DOCUMENTS

EP   2 091 156   8/2009

(Continued)

OTHER PUBLICATIONS

Digital Video Broadcasting (DVB) User Guidelines for the Second Generation System for Broadcasting, Interactive Services, News Gathering and other Broadband Satellite Applications (DVB-S2), ETSI TR 102 376 V1.1.1, XP002617373, Feb. 1, 2005.

(Continued)

*Primary Examiner* — Dieu-Minh Le
(74) *Attorney, Agent, or Firm* — The Farrell Law Firm, P.C.

(57) ABSTRACT

A method and apparatus are provided for generating a parity check matrix used to generate a linear block code in a communication system. The method includes determining a basic parameter of a second parity check matrix satisfying a rule predetermined with respect to a given first parity check matrix, generating a submatrix corresponding to a parity part of the second parity check matrix, using the basic parameter; and generating a submatrix corresponding to an information word part of the second parity check matrix, using the first parity check matrix and the basic parameter.

12 Claims, 12 Drawing Sheets

FOREIGN PATENT DOCUMENTS

| | | |
|---|---|---|
| KR | 1020040092922 | 11/2004 |
| KR | 1020070068675 | 7/2007 |
| KR | 1020090003164 | 1/2009 |
| KR | 1020090089253 | 8/2009 |
| KR | 1020090113869 | 11/2009 |
| WO | WO 2006/039801 | 4/2006 |
| WO | WO 2008/092040 | 7/2008 |

OTHER PUBLICATIONS

Brian Classon et al., "LDPC Coding for OFDMA PHY", IEEE 802.16 Broadband Wireless Access Working Group, XP-002371218, Aug. 17, 2004.

* cited by examiner $$H_1 = \begin{bmatrix} 1 & 1 & 1 & 1 & 1 & 0 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

FIG. 4
(PRIOR ART)

APPARATUS AND METHOD FOR GENERATING A PARITY CHECK MATRIX IN A COMMUNICATION SYSTEM USING LINEAR BLOCK CODES, AND A TRANSMISSION/RECEPTION APPARATUS AND METHOD USING THE SAME

PRIORITY

This application claims priority under 35 U.S.C. §119(a) to Korean Patent Applications filed in the Korean Intellectual Property Office on Nov. 2, 2009, Mar. 26, 2010, Jun. 9, 2010, and Aug. 24, 2010, which were assigned Serial Nos. 10-2009-0105092, 10-2010-0027322, 10-2010-0054388, and 10-2010-0082182, respectively, the disclosures of all of which are hereby incorporated by reference.

BACKGROUND OF THE INVENTION

1. Field of the Invention

The present invention relates generally to a communication system using linear block codes, and more particularly, to a transmission/reception apparatus and method for generating linear block codes in a specific form.

2. Description of the Related Art

In wireless communication systems, link performances are significantly degraded by various noises, fading, and Inter-Symbol Interference (ISI) of channels. Therefore, to realize high-speed digital communication systems requiring high data throughput and reliability, such as a next-generation mobile communication system, a digital broadcasting system, and a mobile Internet system, it is important to develop technologies for coping with the noises, fading, and ISI. Recently, error-correcting codes have been studied to improve communication reliability by efficiently restoring information distortion.

A Low-Density Parity Check (LDPC) code will be referred to herein as an example of a linear block code, but the present invention is not limited to the LDPC code.

The LDPC code is commonly represented using a graph representation, and its many characteristics can be analyzed by graph theory and methods based on algebra and probability theory. Generally, a graph model of channel codes is not only useful in code description, but also can be regarded as a communication network in which vertexes exchange messages through edges, if information about encoded bits are mapped to vertexes in the graph and relationships between the bits are mapped to edges in the graph, thus making it possible to derive a natural decoding algorithm. For example, in a trellis, which is a kind of graph, a derived decoding algorithm may include the well known Viterbi algorithm, and Bahl, Cocke, Jelinek, and Raviv (BCJR) algorithm.

The LDPC code is generally defined as a parity check matrix, and can be represented using a bipartite graph, which is referred to as a Tanner graph. In the bipartite graph, vertexes are divided into two different types, and the LDPC code is represented by a bipartite graph including vertexes called variable nodes and check nodes. The variable nodes are mapped to encoded bits on a one to one basis.

FIG. 1 illustrates an example of a parity check matrix $H_1$ of an LDPC code, which includes four rows and eight columns.

Referring to FIG. 1, by having eight columns, the parity check matrix $H_1$ generates a length-8 codeword in an LDPC code, and its columns are mapped to eight encoded bits on a one to one basis.

FIG. 2 illustrates a Tanner graph corresponding to the parity check matrix $H_1$ of FIG. 1.

Referring to FIG. 2, the Tanner graph of the LDPC code includes eight variable nodes $x_1$ 202, $x_2$ 204, $x_3$ 206, $x_4$ 208, $x_5$ 210, $x_6$ 212, $x_7$ 214, and $x_8$ 216, and four check nodes 218, 220, 222, and 224. An i-th column and a j-th row of the parity check matrix $H_1$ of the LDPC code are mapped to a variable node $x_i$ and a j-th check node, respectively. In addition, a value of 1, i.e., a non-zero value, at the point where an i-th column and a j-th row of the parity check matrix $H_1$ of the LDPC code cross each other, means that an edge connecting the variable node $x_i$ to the j-th check node exists on the Tanner graph as illustrated in FIG. 2.

In the Tanner graph of the LDPC code, a degree of each of a variable node and a check node indicates the number of edges connected to the node, and is equal to the number of entries whose values are not '0' in a row or a column corresponding to the node in the parity check matrix of the LDPC code. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively, and degrees of the check nodes 218, 220, 222 and 224 are 6, 5, 5 and 5, respectively. In addition, the number of entries whose values are not '0' in columns of the parity check matrix $H_1$ in FIG. 1, which correspond to the variable nodes in FIG. 2, are identical to their associated degrees of 4, 3, 3, 3, 2, 2, 2, and 2, respectively, and the number of entries whose values are not '0' in rows of the parity check matrix $H_1$ in FIG. 1, which correspond to the check nodes in FIG. 2, are identical to their associated degrees of 6, 5, 5, and 5, respectively.

In order to express degree distribution for nodes of an LDPC code, assuming that a ratio of the number of variable nodes with degree=i to the total number of variable nodes is $f_i$, and a ratio of the number of check nodes with degree=j to the total number of check nodes is $g_j$, in the LDPC code corresponding to FIGS. 1 and 2, $f_2=4/8$, $f_3=3/8$, and $f_4=1/8$; $f_i=0$ for $i \neq 2, 3, 4$; $g_5=3/4$ and $g_6$ 1/4; and $g_j=0$ for $j \neq 5, 6$. If a length of a codeword in an LDPC code, i.e., the number of columns in a parity check matrix, is N and the number of rows is N/2, a density of entries whose values are not '0' in the entire parity check matrix having the above degree distribution is calculated in accordance with Equation (1) below.

$$\frac{2f_2 N + 3f_3 N + 4f_4 N}{N \cdot N/2} = \frac{5.25}{N} \tag{1}$$

In Equation (1), the density of '1' decreases with an increase in N in the parity check matrix. Generally, because for an LDPC code, the density of non-zero entries is inversely proportional to the codeword length N, an LDPC code with a large value for N has a very low density. The wording 'low density' in the name of the LDPC code was derived from this principle.

FIG. 3 is a diagram illustrating a schematic structure of an LDPC code. Specifically, FIG. 3 illustrates characteristics of a parity check matrix of an LDPC code having a specific structure. For reference, the LDPC code illustrated in FIG. 3 has been adopted as standard technology in European digital broadcasting standards such as DVB-S2, DVB-T2, and DVB-C2.

Referring to FIG. 3, $N_1$ denotes a length of a codeword in an LDPC code, $K_1$ denotes a length of an information word, and $(N_1-K_1)$ denotes a length of parity bits. In addition, integers $M_1$ and q are defined by $q=(N_1-K_1)/M_1$. $K_1/M_1$ is also an integer. For convenience of description, the parity check matrix of FIG. 3 will be assumed to be a first parity check matrix $H_1$.

In the parity check matrix of FIG. 3, a parity part (corresponding parity bits) including $K_1$-th to $(K_1-1)$-th columns has a structure in a dual diagonal shape. Therefore, as to degree distribution of the columns corresponding to the parity part, all columns have a degree of 2, except for the last column having a degree of 1.

In the parity check matrix, an information word part consisting of 0-th to $(K_1-1)$-th columns has a structure, which is formed according to the following rules.

Rule (1): A total of $K_1/M_1$ column groups are generated by grouping $K_1$ columns for the information word into $M_1$ groups in the parity check matrix. Each column in each column group is formed according to Rule (2) below.

Rule (2): First, locations of 1 in each 0-th column in an i-th column group (where $i=0, 1, \ldots, K_1/M_1-1$) are determined. A degree of a 0-th column in an i-th column group is represented by $D_i$. If locations of rows with 1 are $R_{i,0}^{(1)}$, $R_{i,0}^{(2)}, \ldots, R_{i,0}^{(D_i)}$, then locations $R_{i,j}^{(k)}$ ($k=1, 2, \ldots, D_i$) of rows with 1 in a j-th column (where $j=1, 2, \ldots, M_1-1$) in an i-th column group can be defined as shown Equation (2) below.

$$R_{i,j}^{(k)} = R_{i,(j-1)}^{(k)} + q \bmod(N_1-K_1) \quad (2)$$

$$k=1, 2, \ldots, D_i, i=0, 1, \ldots, K_1/M_1-1, j=1, 2, \ldots, M_1-1$$

According to the rules above, degrees of columns in an i-th ($i=0, 1, \ldots, K_1/M_1-1$) column group are all $D_i$.

As a more detailed example, as to each 0-th column in each of three column groups for $N_1=30$, $K_1=15$, $M_1=5$, $q=3$, location information of rows with 1 can be represented as follows. For example, if $\{0, 1, 2\}$ is a 0-th column group, $\{0, 1, 2\}$ indicates that 1 exists in a 0-th row, a 1-st row and a 2-nd row in a 0-th column in the 0-th column group.

$$R_{1,0}^{(1)}=0, R_{1,0}^{(2)}=1, R_{1,0}^{(3)}=2,$$

$$R_{2,0}^{(1)}=0, R_{2,0}^{(2)}=11, R_{2,0}^{(3)}=13,$$

$$R_{3,0}^{(1)}=0, R_{3,0}^{(2)}=10, R_{3,0}^{(3)}=14,$$

For information about rows with 1 in each 0-th column in each column group, only location information may be represented on a column group basis for convenience, as follows:

```
0  1   2
0  11  13
0  10  14
```

That is, the sequence sequentially represents information about rows with 1 for a 0-th column in an i-th column group.

By making a parity check matrix using the information in the above detailed example, and Rules (1) and (2), an LDPC code having the same concept as that of the LDPC code with the structure of FIG. 3 may be generated as illustrated in FIG. 4.

Next, reference will be made to a process of performing LDPC encoding using the parity check matrix.

For convenience, information bits with a length $K_1$ are represented by $(i_0, i_1, \ldots, i_{K_1-1})$ and parity bits with a length $N_1-K_1$ are represented by $(p_0, p_1, \ldots, p_{N_1-K_1-1})$. An LDPC code described in detail below has characteristics of $N_1=16200$, $K_1=10800$, $M_1=360$, and $q=15$.

Encoding Method of an LDPC Code

Step 1: Parity bits are initialized.

$$p_0 = p_1 = \ldots = p_{N_1-K_1-1} = 0$$

Step 2: Information about rows with 1 in a 0-th column in a first column group of an information word is called from information about the stored parity check matrix.

$$R_{1,0}^{(1)}=0, R_{1,0}^{(2)}=2084, R_{1,0}^{(3)}=1613, R_{1,0}^{(4)}=1548, R_{1,0}^{(5)}=1286, R_{1,0}^{(6)}=1460, R_{1,0}^{(7)}=3196,$$
$$R_{1,0}^{(8)}=4297, R_{1,0}^{(9)}=2481, R_{1,0}^{(10)}=3369,$$
$$R_{1,0}^{(11)}=3451, R_{1,0}^{(12)}=4620, R_{1,0}^{(13)}=2622$$

Using the called information and information bit $i_0$, specific parity bits $p_x$ are updated as shown in Equation (3) below, where x is a value of $R_{1,0}^{(k)}$, for $k=1, 2, \ldots, 13$.

$$p_0 = p_0 \oplus i_0, p_{2048} = p_{2048} \oplus i_0, p_{1613} = p_{1613} \oplus i_0,$$
$$p_{1548} = p_{1548} \oplus i_0, p_{1286} = p_{1286} \oplus i_0, p_{1460} = p_{1460} \oplus i_0,$$
$$p_{3196} = p_{3196} \oplus i_0, p_{4297} = p_{4297} \oplus i_0, p_{2481} = p_{2481} \oplus i_0,$$
$$p_{3369} = p_{3369} \oplus i_0, p_{3451} = p_{3451} \oplus i_0, p_{4620} = p_{4620} \oplus i_0,$$
$$p_{2622} = p_{2622} \oplus i_0 \quad (3)$$

In Equation (3), $\oplus$ represents binary addition, and $p_x = p_x \oplus i_0$ is exchangeable with $p_x \leftarrow p_x \oplus i_0$.

Step 3: For the next 359 information bits $i_1, i_2, \ldots, i_{359}$ succeeding $i_0$, a value of Equation (4) below is obtained.

$$\{x + (m \bmod M_1) \times q\} \bmod(N_1-K_1), m=1, 2, \ldots, 359 \quad (4)$$

In Equation (4), x is a value of $R_{1,0}^{(k)}$, for $k=1, 2, \ldots, 13$. It is to be noted that Equation (4) is similar in concept to Equation (2).

Using the values obtained in Equation (4), an operation similar to that of Equation (3) is performed. That is, $p_{\{x+(m \bmod M_1) \times q\} \bmod(N_1-K)}$ is updated for $i_m$.

For example, for $m=1$, i.e., for $i_1$, $p_{\{x+q\} \bmod(N_1-K_1)}$ is updated as shown in Equation (5) below.

$$p_{15} = p_{15} \oplus i_1, p_{2099} = p_{2099} \oplus i_1, p_{1628} = p_{1628} \oplus i_1,$$
$$p_{1563} = p_{1563} \oplus i_1, p_{1301} = p_{1301} \oplus i_1, p_{1475} = p_{1475} \oplus i_1,$$
$$p_{3211} = p_{3211} \oplus i_1, p_{4312} = p_{4312} \oplus i_1, p_{2496} = p_{2496} \oplus i_1,$$
$$p_{3384} = p_{3384} \oplus i_1, p_{3466} = p_{3466} \oplus i_1, p_{4635} = p_{4635} \oplus i_1,$$
$$p_{2637} = p_{2637} \oplus i_1 \quad (5)$$

It is to be noted that in Equation (5), $q=15$. The above process is performed in a similar manner for $m=1, 2, \ldots, 359$.

Step 4: Like in Step 2, information about $R_{2,0}^{(k)}$ ($k=1, 2, \ldots, 13$) is called for a $361^{st}$ information bit $i=360$ to update specific parity bits $p_x$, where x is $R_{2,0}^{(k)}$. For the next 359 information bits succeeding $i_{361}, i_{362}, \ldots, i_{719}$ succeeding $i=360$, $p_{\{x+(m \bmod M_1) \times q \bmod(N_1-K_1)\}}$, (for $m=361, 362, \ldots, 719$) are updated by applying Equation (4) in a similar manner.

Step 5: For each of 360 information bit groups, Steps 2, 3, and 4 are repeated. Finally, parity bits are determined using Equation (6) below.

$$p_i = p_i \oplus p_{i-1}, i=1, 2, \ldots, N_1-K_1-1 \quad (6)$$

In Equation (6), bits $p_i$ are parity bits that have completely undergone LDPC encoding.

Accordingly, using the above-described LDPC encoding method, encoding is performed through Steps 1 through 5.

It is well known that performances of common LDPC codes are closely related to cycle characteristics of the Tanner graph. In particular, it has been determined through experimentation that performance degradation may occur if there are many short-length cycles in the Tanner graph. Therefore, to design LDPC codes having excellent performance, cycle characteristics on the Tanner graph should be considered.

Briefly, the cycle characteristics are the number of nodes by which an edge has passed while in the Tanner graph, the edge starting at one variable node returns to the variable node after passing by at least one check node and other variable nodes. For example, in FIG. 2, a path of 202->218->204->220->202 may be construed as one cycle. It is important to design LDPC codes such that such cycle characteristics have an optimal length, which is neither too short nor long.

However, it is very difficult to design a parity check matrix of a very large LDPC code whose codeword length is about tens of thousands of bits, considering cycle characteristics on the Tanner graph. Actually, no design method has yet been proposed, which improves cycle characteristics of LDPC codes having the specific structure of FIG. 3. In reality, in LDPC codes having the above structure, an error floor is observed at a high Signal to Noise Ratio (SNR), because optimization of cycle characteristics on the Tanner graph is not considered.

Accordingly, for designing LDPC codes having the specific structure of FIG. 3, an efficient method is required, which designs a parity check matrix while improving cycle characteristics.

Additionally, in European digital broadcasting standards using the LDPC code, the possible number of lengths of a coded block of the LDPC code is only two due to the limited use of the code, and to support even these two block lengths, different parity check matrixes are stored.

However, to apply LDPC codes to an actual communication system, the LDPC codes should be designed to be suitable to data throughput required in the communication system. Particularly, LDPC codes having various block lengths are required to support various data throughputs upon a user's request, not only in adaptive communication systems utilizing Hybrid Automatic Retransmission reQuest (HARQ) and Adaptive Modulation and Coding (AMC), but also in a communication system supporting various broadcast services.

In addition, because storing an independent parity check matrix for each block length of an LDPC code reduces memory efficiency, there is a need to study a new method for efficiently supporting various block lengths from the given existing parity check matrix, without designing a new parity check matrix.

SUMMARY OF THE INVENTION

Accordingly, the present invention is designed to address at least the above-described problems and/or disadvantages and to provide at least the advantages described below. An aspect of the present invention is to provide a parity check matrix generation method for generating a linear block code having a variable block length in a communication system.

Another aspect of the present invention is to provide a parity check matrix generation method for generating a structured LDPC code having a variable block length in a communication system.

Another aspect of the present invention is to provide a transmission/reception method and apparatus using the parity check matrix generation method.

Another aspect of the present invention is to provide a method and apparatus for efficiently generating a parity check matrix of an LDPC code by suboptimizing cycle characteristics in designing an LDPC code having a specific structure.

Another aspect of the present invention is to provide a method and apparatus for encoding and decoding an LDPC code having a variable block length by suboptimizing cycle characteristics from one parity check matrix in a communication system using LDPC codes.

Another aspect of the present invention is to provide a method and apparatus for generating LDPC codes having different block lengths from a parity check matrix designed by suboptimizing cycle characteristics, to improve efficiency of a memory for storing LDPC codes.

In accordance with an aspect of the present invention, a method is provided for generating a parity check matrix used to generate a linear block code in a communication system. The method includes determining a basic parameter of a second parity check matrix satisfying a rule predetermined with respect to a given first parity check matrix; generating a submatrix corresponding to a parity part of the second parity check matrix, using the basic parameter; and generating a submatrix corresponding to an information word part of the second parity check matrix, using the first parity check matrix and the basic parameter.

In accordance with another aspect of the present invention, a method is provided for encoding a linear block code using the second parity check matrix generated according to the above method.

In accordance with another aspect of the present invention, a method is provided for decoding the linear block code using the second parity check matrix generated according to the above method.

In accordance with another aspect of the present invention, a transmission apparatus in a communication system is provided. The apparatus includes an encoder for encoding an information work into a linear block code; a transmitter for transmitting the linear block code; and a controller for determining a second parity check matrix from a given first parity check matrix according to the linear block code, and controlling the encoder to perform encoding using the second parity check matrix. The controller determines a basic parameter of the second parity check matrix satisfying a rule predetermined with respect to the given first parity check matrix, generates a submatrix corresponding to a parity part of the second parity check matrix, using the basic parameter, and generates a submatrix corresponding to an information word part of the second parity check matrix, using the first parity check matrix and the basic parameter.

In accordance with another aspect of the present invention, a reception apparatus in a communication system is provided. The apparatus includes a receiver for receiving a signal transmitted over a communication network; a decoder for decoding the received signal encoded in a linear block code, into an information word; and a controller for determining a second parity check matrix from a given first parity check matrix according to the linear block code, and controlling the decoder to perform decoding using the second parity check matrix. The controller determines a basic parameter of the second parity check matrix satisfying a rule predetermined with respect to the given first parity check matrix, generates a submatrix corresponding to a parity part of the second parity check matrix, using the basic parameter, and generates a submatrix corresponding to an information word part of the second parity check matrix, using the first parity check matrix and the basic parameter.

BRIEF DESCRIPTION OF THE DRAWINGS

The above and other aspects, features, and advantages of certain embodiments of the present invention will be more apparent from the following description taken in conjunction with the accompanying drawings, in which:

Figure 4:
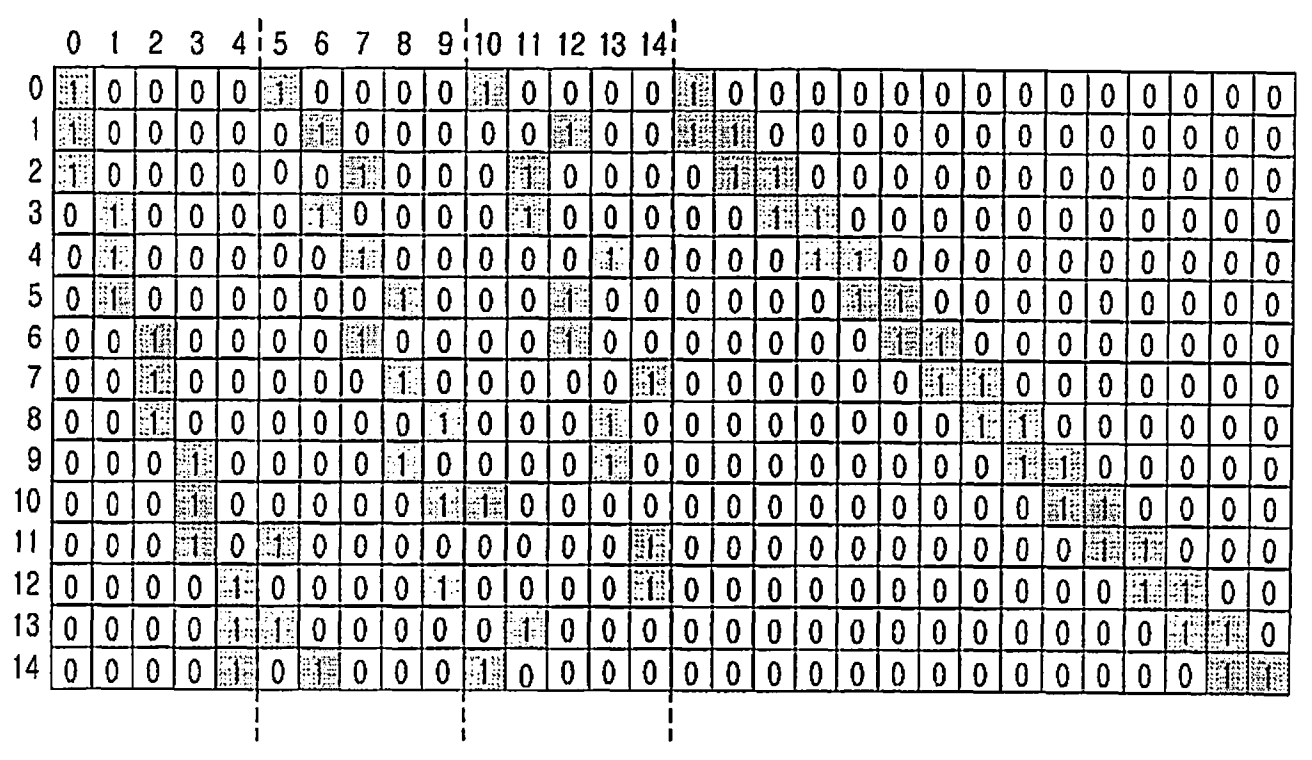

FIG. 4 is a diagram illustrating an example of a parity check matrix of an LDPC code;

Throughout the drawings, the same drawing reference numerals will be understood to refer to the same elements, features and structures.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

In accordance with an embodiment of the present invention, a method for generating a parity check matrix of an LDPC code, for example, a linear block code, is provided. It should be noted that the parity check matrix generation method described below may be applied in the same way to other linear block codes that use a parity check matrix, not just an LDPC code.

Methods for generating a parity check matrix of a large-sized LDPC code from a parity check matrix of a given basic small-sized LDPC code are provided below. In addition, an apparatus for supporting a variable block length in a communication system using LDPC codes in a specific shape, and a method for controlling the same are also provided. It should be apparent to those skilled in the art that a parity check matrix of a small-sized LDPC code may be generated from a parity check matrix of a given large-sized LDPC code using the following methods. However, the present invention is not limited to supporting all of the designed variable block lengths.

Figures 1, 2:
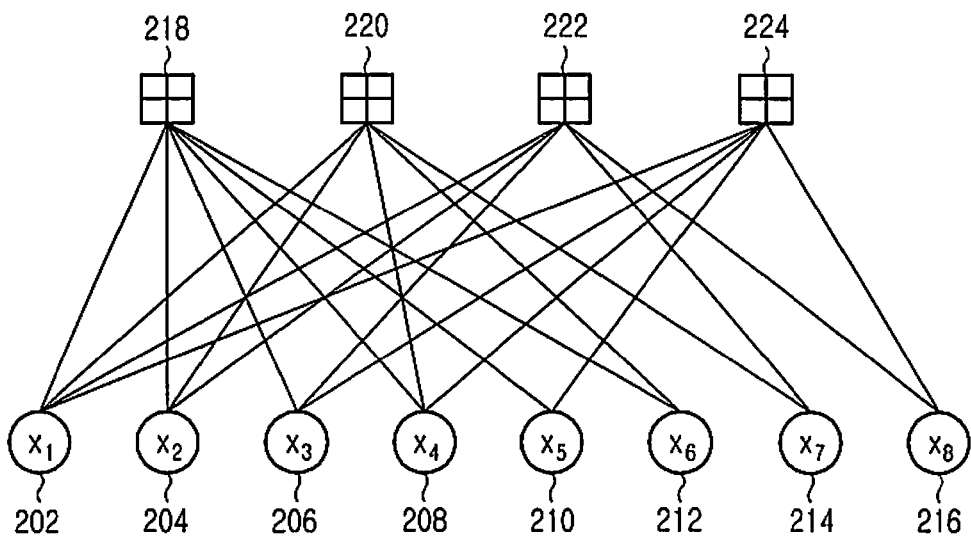
FIG. 1 is a diagram illustrating an example of a parity check matrix of a length-8 LDPC code.
FIG. 2 is a diagram illustrating an example of a Tanner graph of a parity check matrix of a length-8 LDPC code.
Figure 3:
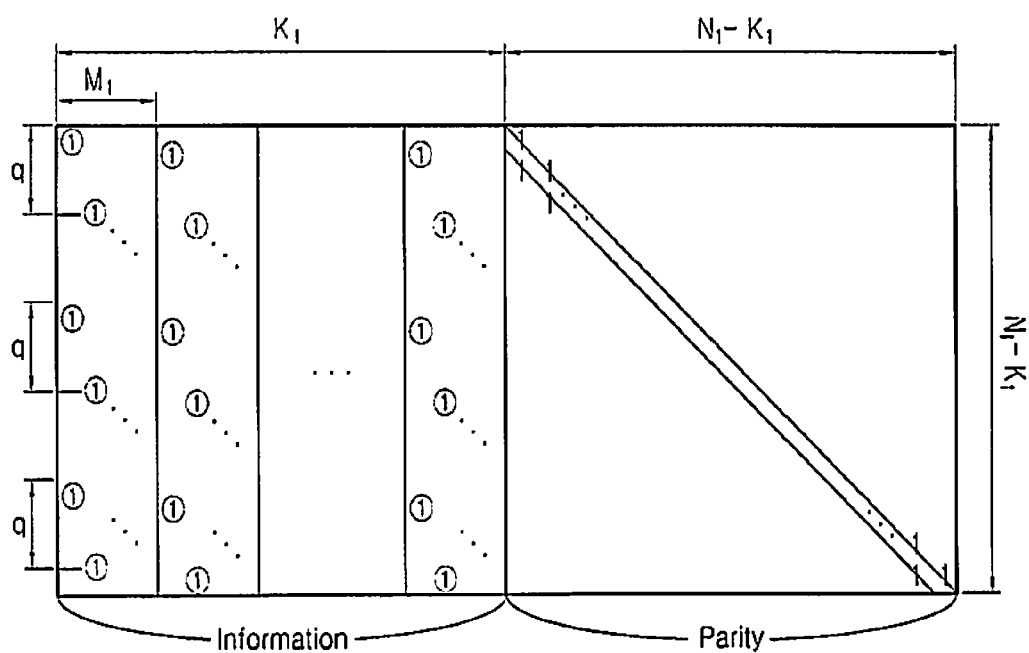
FIG. 3 is a diagram illustrating a schematic structure of an LDPC code.

For convenience of description, an LDPC code will have the same structure as the LDPC code designed based on Rules (1) and (2) of the prior art, as illustrated in FIG. 3. Further, a parity check matrix of the given LDPC code is a first parity check matrix $H_1$ and its codeword (coded block) length and information word length are $N_1$ and $K_1$, respectively. Therefore, a length of parity is $(N_1-K_1)$. Also, $M_1$ and q are determined to meet $q=(N_1-K_1)/M_1$, and $K_1/M_1$ is also an integer. Locations of rows with 1 in each 0-th column in an i-th $(i=0, 1, \ldots, K_1/M_1-1)$ column group, representing information about the parity check matrix $H_1$, are $R_{i,0}^{(1)}, R_{i,0}^{(2)}, \ldots, R_{i,0}^{(D_i)}$, where $D_i$ is a degree of a 0-th column in an i-th column group.

In accordance with an embodiment of the present invention, a method is provided for designing a second parity check matrix $H_2$ satisfying the following rules. A codeword length and an information word length of the parity check matrix $H_2$ are $N_2$ and $K_2$, respectively.

Rule (3): For a positive integer p, $N_2=pN_1$, $K_2=pK_1$, and $M_2=pM_1$. Therefore, $K_2/M_2=K_1/M_1$ is satisfied, assuring that $H_2$ is equal to $H_1$ in the number of column groups in the information word part. In addition, $(N_2-K_2)/M_2=q=(N_1-K_1)/M_1$ is given.

Rule (4): $H_2$ and $H_1$ are equal in degree distribution for the information word part. Locations of rows with 1 in each 0-th column in an i-th $(i=0, 1, \ldots, K_2/M_2-1)$ column group of the parity check matrix $H_2$ are $S_{i,0}^{(k)} S_{i,0}^{(k)}$, for $(k=1, 2, \ldots, D_i)$, where $D_i$ is a degree of a 0-th column in an i-th column group.

Rule (5): Cycle characteristics on a Tanner graph of $H_2$ should be equal to or better than cycle characteristics on a Tanner graph of $H_1$.

Rule (6): $H_1$ should be able to be generated from information about $H_2$.

Rule (7): An LDPC code defined by $H_1$ should be able to be encoded using information about $H_2$.

Figure 5:
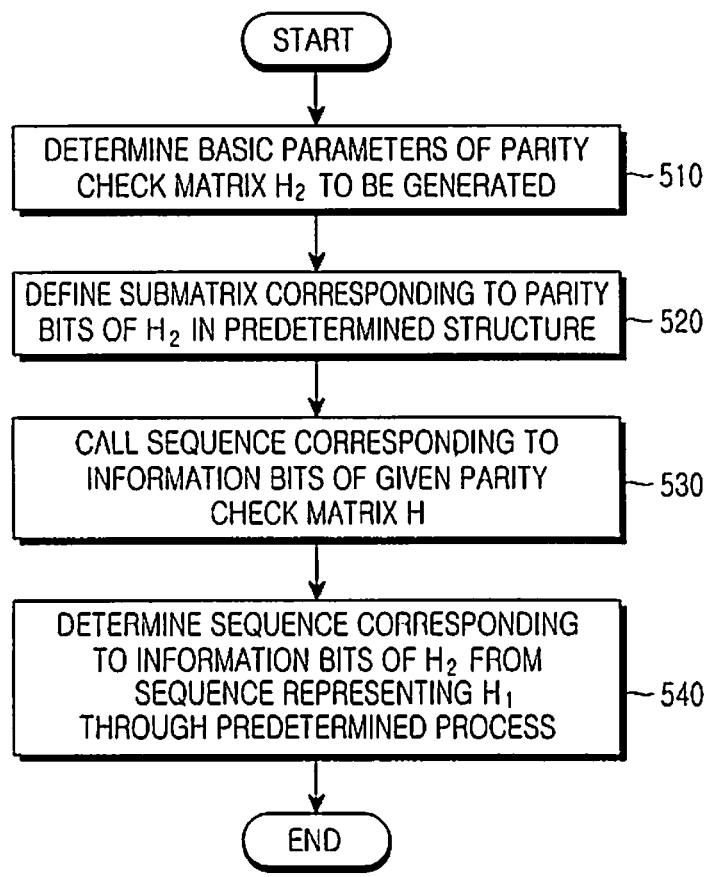
FIG. 5 is a flow diagram illustrating a method for generating a parity check matrix of a linear block code according to an embodiment of the present invention.

In accordance with an embodiment of the present invention, the following method is provided for generating a parity check matrix of an LDPC code, as illustrated in the flowchart of FIG. 5, to generate a parity check matrix $H_2$ of an LDPC code satisfying Rules (3), (4), (5), (6) and (7). For ease of description, it is assumed that in Rule (4), $D_0 \leq \ldots D_{K_1/M_1-2} \leq D_{K_1/M_1-1}$ is satisfied without loss of generality.

Method of Generating Parity Check Matrix of LDPC Code

FIG. 5 is a flow diagram illustrating a method for generating a parity check matrix of a linear block code according to an embodiment of the present invention.

Referring to FIG. 5, in step 510, basic parameters of a parity check matrix $H_2$ to be generated are determined. The basic parameters include a length of a codeword (i.e., coded block) of an LDPC code, and a size in which an information word is to be subjected to grouping, i.e., a size of a column group in the parity check matrix $H_2$.

In step 520, a submatrix corresponding to parity bits of the parity check matrix $H_2$ is defined in a predetermined structure. More specifically, the operation of step 520 includes the following Steps 1 and 2.

Step 1: An $(N_2-K_2) \times (N_2-K_2)$ matrix having the same structure as that of a submatrix corresponding to the parity bits of FIG. 3 is set as a submatrix corresponding to a parity part of $H_2$.

Step 2: 'i' is initialized to 0 (i=0).

In step 530, a sequence corresponding to information bits of the given parity check matrix $H_1$ is called. More specifically, the operation of step 530 includes the following Step 3.

Step 3: For each component of a sequence $R_{i,0}^{(k)}$ (k=1, 2, \ldots, $D_i$) representing information about an i-th column group corresponding to information bits of the parity check matrix $H_1$, a set $A_i^{(k)}$ consisting of p elements is defined.

In step 540, from the sequence representing the parity check matrix $H_1$, a sequence corresponding to information bits is determined in the parity check matrix $H_2$ using the following Step 4.

Step 4: Assuming that components of a submatrix corresponding to $(i+1)$-th through $((N_2-K_2)/M_2-1)$-th column groups, which correspond to information bits in the parity check matrix $H_2$, are all zero (0), sequences $S_{i,0}^{(k)}$ (k=1, 2, \ldots, $D_i$) satisfying the following conditions are sequentially obtained.

Condition (1)

$$S_{i,0}^{(k)} \in A_i^{(k)}, \text{for } k=1,2,\ldots,D_i$$

Condition (2)

Among sequences satisfying Condition (1), if there are several sequences having the best cycle characteristics on the Tanner graph, i.e., if there are several best sequences, then one of them is selected arbitrarily.

Step 5: For *i=1, ..., $(N_2-K_2)/M_2-1$, Steps 3 and 4 are repeated. That is, step 530 and step 540 are repeated for i= 1, ..., $(N_2-K_2)/M_2-1$, although not illustrated in FIG. 5.

In accordance with an embodiment of the present invention, $A_i^{(k)}$ is generated in Step 3 above, using Equation (7) or Equation (8) below.

$$A_i^{(k)} = \{R_{i,0}^{(k)}, R_{i,0}^{(k)} + (N_1-K_1), \ldots, R_{i,0}^{(k)} + (p-1) \times (N_1-K_1)\} \quad (7)$$

$$A_i^{(k)} = \{(R_{i,0}^{(k)} - s_i^{(k)}) \times p + s_i^{(k)}, (R_{i,0}^{(k)} - s_i^{(k)}) \times p + s_i^{(k)} - q\}, \ldots, (R_{i,0}^{(k)} - s_i^{(k)}) \times p + s_i^{(k)} - (p-1) \times q\} \quad (8)$$

In Equation (8), $s_i^{(k)}$ ($k=0, 1, \ldots, D_i-1$) is defined as shown in Equation (9) below.

$$s_i^{(k)} = R_i^{(k)} \bmod q, k=0,1,\ldots,D_i-1 \quad (9)$$

Figure 6:
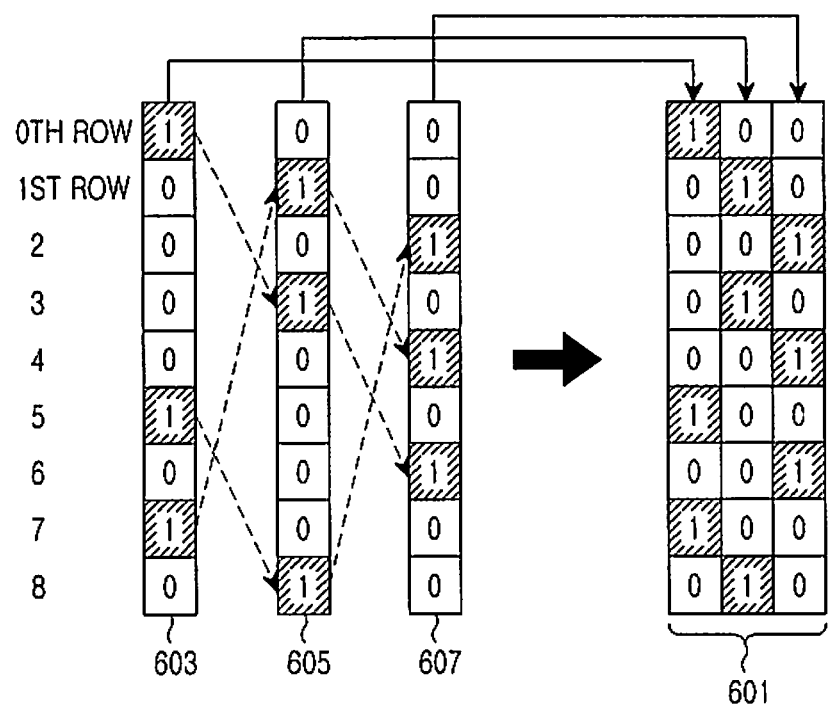
FIGS. 6 to 10 are diagrams illustrating a method for generating a parity check matrix of a linear block code according to an embodiment of the present invention.
Figure 7:
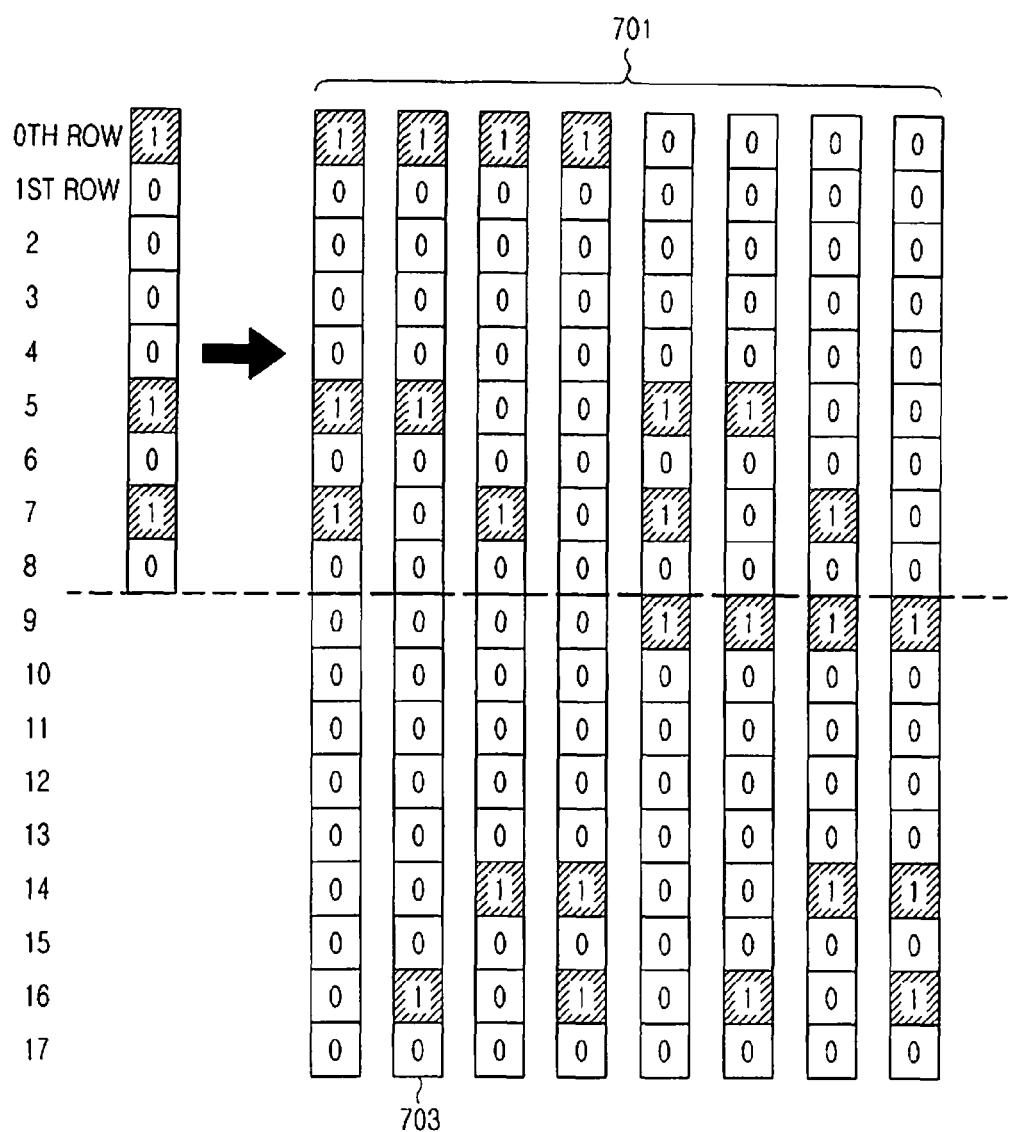
Figure 8:
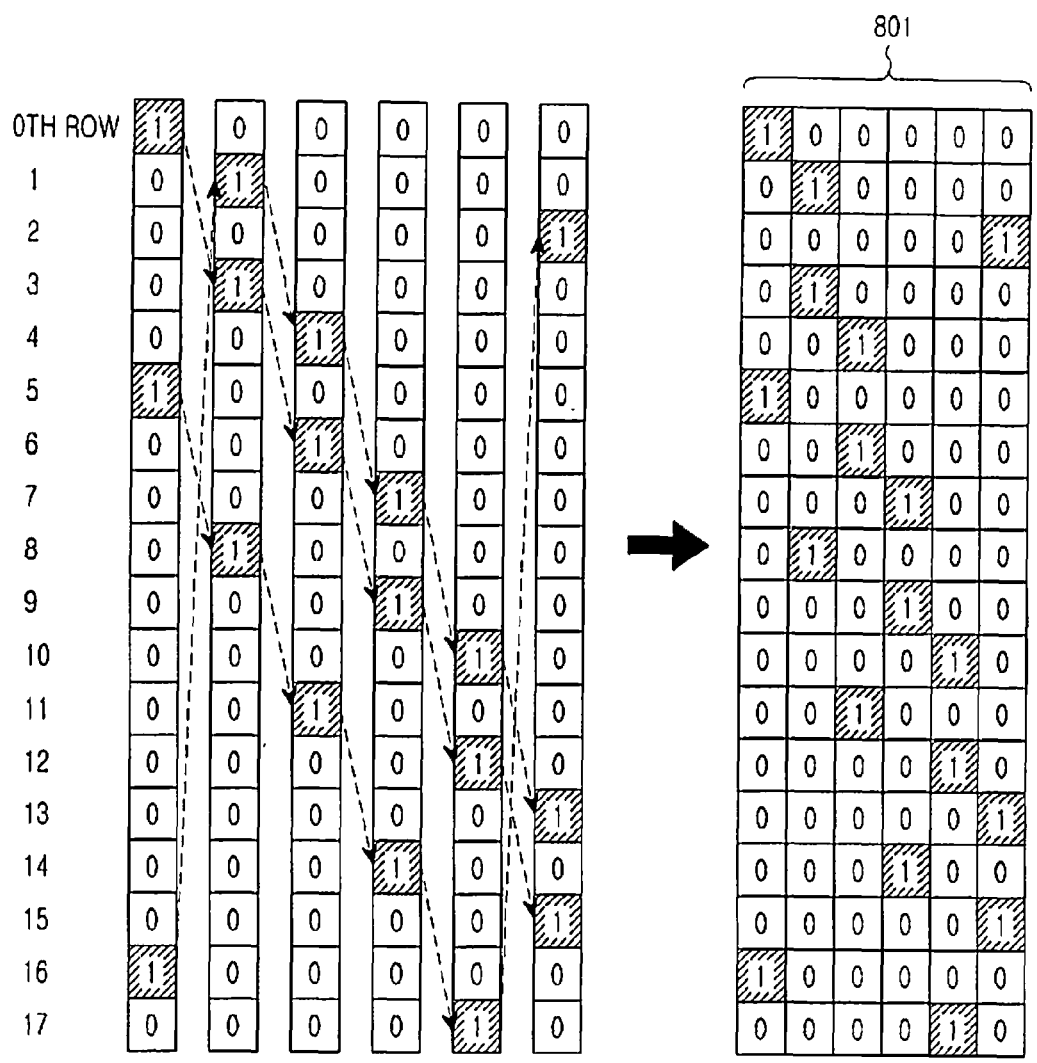

For a better understanding of the method illustrated in FIG. 5, examples are illustrated in FIGS. 6, 7 and 8, which will be described below. Reference will first be made to an example in which Equation (7) is used in Step 3.

The major parameters used to describe the example of FIG. 6 include $M_1=3$, $p=2$, $M_2=pM_1=6$, $(N_1-K_1)=9$ and $q=(N_1-K_1)/3=3$, and location information of rows with 1 in a 0-th column 603 in one column group 601 is 0, 5, and 7. In other words, it can be noted that in a 0-th column 603 in the given one column group 601, 1 exists in the 0-th, 5-th, and 7-th rows. It is also noted that first and second columns 605 and 607 in the given column group 601 can be simply obtained by cyclic-shifting locations of 1 in the 0-th column 603 by q=3 for modulo $(N_1-K_1)=9$. It is noted that degrees of the columns 603, 605, and 607 in the column group 601 of FIG. 6 are all 3, and degrees of rows are all 1.

Reference will now be made to FIG. 7, describing a structure of a 0-th column in a new column group obtainable from the given column group of FIG. 6.

Because location information of rows with 1 in a 0-th column in the column group of FIG. 6 is 0, 5, and 7, location information of rows with 1 in a 0-th column in a new column group may be represented as one of {0,5,7}, {0,5,16}, {0,7,14}, {0,14,16}, {5,7,9}, {5,9,16}, {7,9,14}, and {9,14,16}, when only Equation (7) is used in Step 3.

For location information of the eight rows, column structures are sequentially represented as indicated by reference numeral 701 in FIG. 7.

Assuming that in the location information of the eight rows, a sequence satisfying Conditions (1) and (2) through Step 4 was {0,5,16} or a second candidate 703, a 0-th column in the new column group may be defined as a column, of which row length is 18 and in which 1 exists in each of 0-th row, 5-th row and 16-th row.

Now, 1-st through $5=(M_2-1)$-th columns will be generated by applying the method of generating an LDPC code in the form of FIG. 6, to the new 0-th column. In accordance with the method of generating an LDPC code in the form of FIG. 6, the remaining columns can be obtained by cyclic-shifting locations of 1 in the 0-th column by q=3 for modulo $(N_1-K_1)=9$, as illustrated in FIG. 8.

Referring to FIG. 8, degrees of all columns in a column group 801 are all 3, and degrees of rows are all 1. Accordingly, FIG. 8 is equal to FIG. 6 in distribution of degrees in the information word part.

Figure 9:
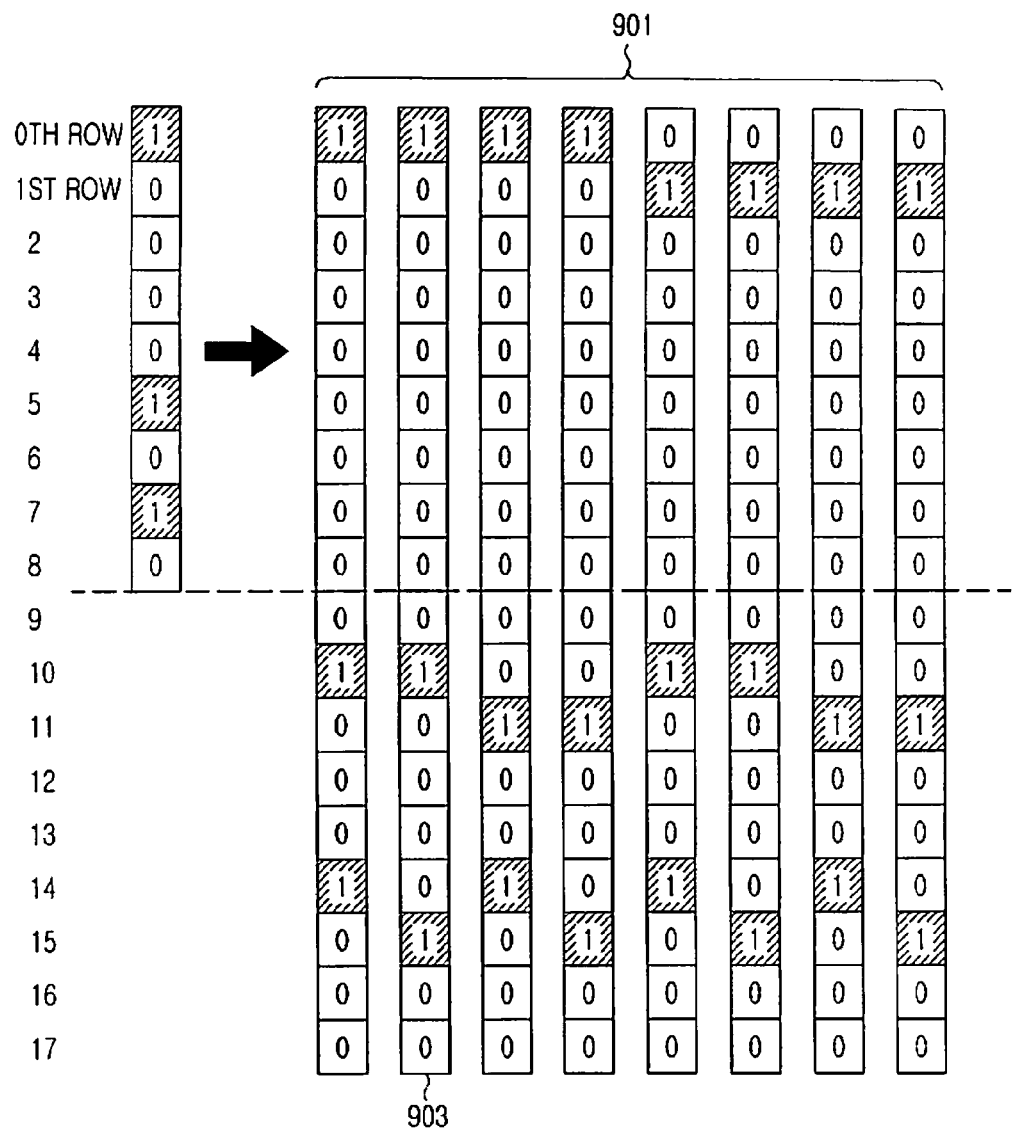

Referring to FIG. 9, a structure is provided of a 0-th column in a new column group obtainable from the given column group of FIG. 6, when Equation (8) is used in Step 3.

Because location information of rows with 1 in a 0-th column in the column group of FIG. 6 is 0, 5, and 7, location information of rows with 1 in a 0-th column in a new column group may be represented as one of {0,10,14}, {0,10,15}, {0,11,14}, {0,11,15}, {1,10,14}, {1,10,15}, {1,11,14}, and {1,11,15}, when Equation (8) is used in Step 3.

For location information of the eight rows, column structures are sequentially represented as indicated by reference numeral 901 in FIG. 9.

Assuming that in the location information of the eight rows, a sequence satisfying Conditions (1) and (2) through Step 4 is {0,10,15} or a second candidate 903, a 0-th column in the new column group may be defined as a column, of which row length is 18 and in which 1 exists in each of 0-th row, 10-th row and 15-th row.

Now, 1-st through $5=(M_2-1)$-th columns will be generated by applying the method of generating an LDPC code in the form of FIG. 3, to the new 0-th column. In accordance with the method of generating an LDPC code in the form of FIG. 3, the remaining columns are obtained by merely cyclic-shifting locations of 1 in the 0-th column by q=3 for modulo $(N_1-K_1)=9$, as illustrated in FIG. 10.

Figure 10:
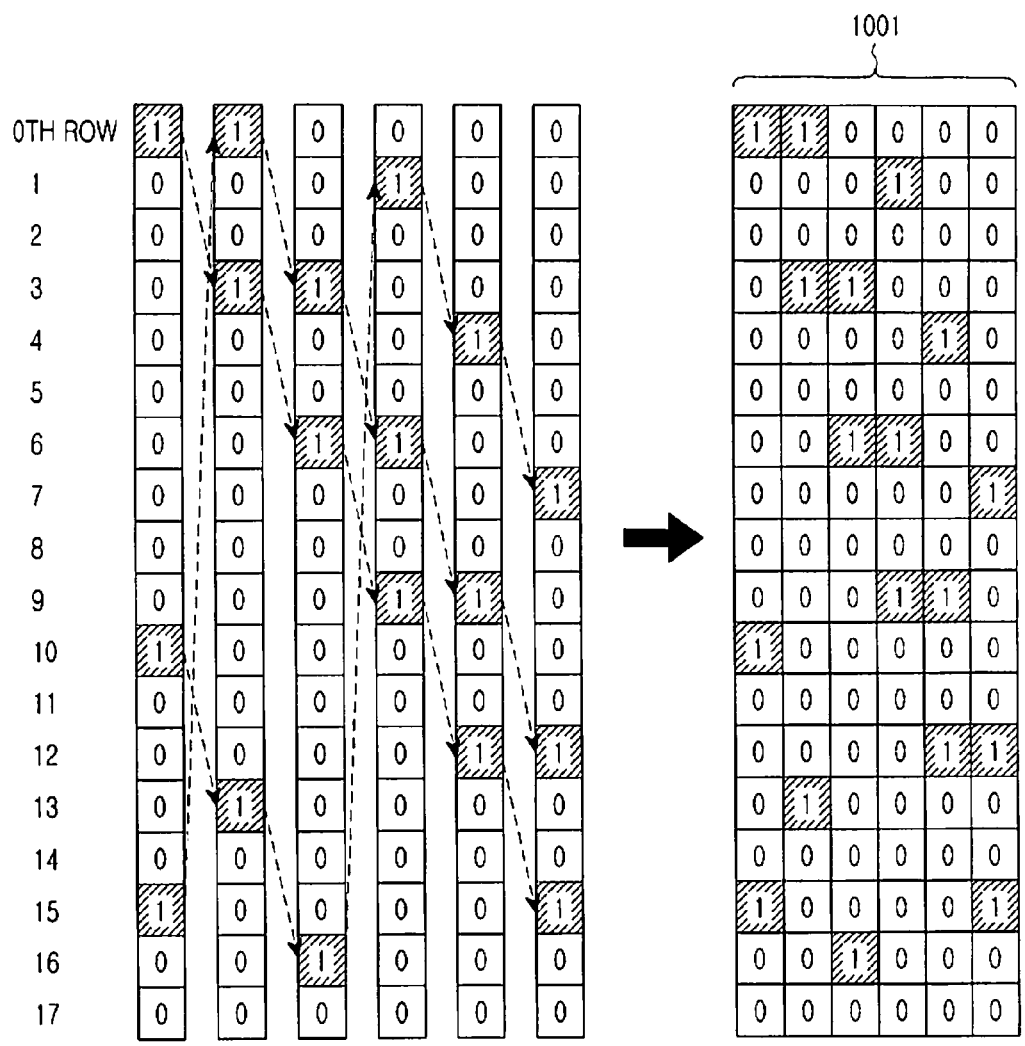

Referring to FIG. 10, degrees of all columns in a column group 1001 are all 3, and degrees of rows are all 1, i.e., FIG. 10 is equal to FIG. 6 in distribution of degrees in the information word part.

As description will now be provided to show that the method illustrated in FIG. 5 satisfies Rules (3), (4), (5), (6) and (7).

Rules (3) and (4) are satisfied on the basic assumptions of the method.

Referring to Rule (5), assuming that $S_{i,0}^{(k)} = R_{i,0}^{(k)}$ for all i and k in Step 4, because the structure of the parity check matrix $H_1$ was applied to the parity check matrix $H_2$ in the same way, $H_2$ is equal to $H_1$ in cycle characteristics on a Tanner graph. In this case, therefore, Rule (5) is satisfied.

However, because a sequence having the best cycle characteristics on a Tanner graph is selected in Step 4, a sequence having cycle characteristics better than or equal to those of $S_{i,0}^{(k)} = R_{i,0}^{(k)}$ is selected for all i and k. That is, it is noted that the worst case may not occur in which cycle characteristics deteriorate, even though it is guaranteed that the cycle characteristics are equal. Therefore, it is noted that Rule (5) is satisfied by Step 4.

Referring to Rule (6), information about column groups representing the parity check matrix $H_2$ is defined as $S_{i,0}^{(k)}$, ($i=0, 1, \ldots, (N_2-K_2)/M_2-1$), $k=1, 2, \ldots, D_i$). When Equation (7) is used in Step 3, $S_{i,0}^{(k)}$ has a form such as $S_{i,0}^{(k)} = R_{i,0}^{(k)} + l \times (N_1-K_1)$ for a certain integer l. Because $N_1$ and $K_1$ are known values, $R_{i,0}^{(k)}$ can be extracted from $S_{i,0}^{(k)}$ using Equation (10) below.

$$R_{i,0}^{(k)} = S_{i,0}^{(k)} \bmod (N_1-K_1) \quad (10)$$

Similarly, when Equation (8) is used in Step 3, $S_{i,0}^{(k)}$ has a form such as $(R_{i,0}^{(k)} - s_i^{(k)}) \times p + s_i^{(k)} - l \times q$ for a certain integer l.

It is noted that because $(R_{i,0}^{(k)} - s_i^{(k)})$ is a multiple of q, $R_{i,0}^{(k)}$ can be easily extracted from $S_{i,0}^{(k)}$ even though a value of $R_{i,0}^{(k)}$ is unknown, because of $s_i^{(k)} = R_{i,0}^{(k)} \bmod q = S_{i,0}^{(k)} \bmod q$. Also, because p and q are already known values, $R_{i,0}^{(k)}$ can be easily extracted from $S_{i,0}^{(k)}$ using Equation (11).

$$R_{i,0}^{(k)} = \left\lceil \frac{S_{i,0}^{(k)} - s_i^{(k)}}{p \times q} \right\rceil \times q + s_i^{(k)} \quad (11)$$

Referring to Equations (10) and (11), if information about column groups of the parity check matrix $H_2$ is known, values of $R_{i,0}^{(k)}$ can be obtained through simple operations without separately storing the values. In addition, because $H_1$ and $H_2$ are equal even in q, $H_1$ can be obtained from $R_{i,0}^{(k)}$ acquired from $S_{i,0}^{(k)}$, thereby satisfying Rule (6).

Referring to Rule (7), all LDPC codes defined by $H_1$ and $H_2$ can be encoded as described in the rules of the prior art. When a code word length, an information word length, and a value of q are given, encoding is performed using only information about rows with 1 in a 0-th column in each column group of the information word. Because $R_{i,0}^{(k)}$ can be obtained from $S_{i,0}^{(k)}$ by Rule (6), Rule (7) is satisfied.

While $H_2$ is obtained from $H_1$ in the description above, by way of example, a larger parity check matrix may be obtained by repeating the method, as illustrated in FIG. 5.

In summary, efficient parity check matrixes may be designed by repeatedly applying the method illustrated in FIG. 5 to parity check matrixes $H_1$, $H_2$, $H_3$, ..., and $H_s$ satisfying Equations (12), (13), and (14) below, in which $N_i$, $K_i$, and $M_i$ denote a codeword length, an information word length, and a unit of a column group in Rule (1), for $H_i$, respectively, and $N_{i+1} = p_i N_i$, $K_{i+1} = p_i K_i$, and $M_{i+1} = p_i M_i$ are satisfied for a certain integer $p_i$ (i=1, ..., s−1).

$$N_1 | N_2 \ldots | N_s \quad (12)$$

$$K_1 | K_2 \ldots | K_s \quad (13)$$

$$M_1 | M_2 \ldots | M_s \quad (14)$$

In addition, if only information about a parity check matrix $H_s$ obtained by the method of FIG. 5 is given, then $H_1$, $H_2$, ..., and $H_{s-1}$ can also be generated all.

It is noted that by satisfying Rule (6), the parity check matrix of an LDPC code, proposed by an embodiment of the present invention, may generate parity check matrixes having various sizes from one parity check matrix. It is also noted that because a size of a parity check matrix indicates a codeword length of its LDPC code, an LDPC code generated by the method proposed in accordance with an embodiment of the present invention can support LDPC codes having various block lengths using Equation (10) or Equation (11). Despite the support of LDPC codes with various block lengths, information about only one parity check matrix is stored, thereby ensuring the high memory efficiency.

In accordance with an embodiment of the present invention, a parity check matrix $H_2$ is efficiently generated by applying the method illustrated in FIG. 5 to a parity check matrix $H_1$ having parameters given in Equations (15) to (20) below, and the generated parity check matrix $H_2$ is represented in Tables 1 to 6.

$$M_1=1, N_1=48, K_1=10, q=38p_1=90, M_2=90, N_2=4320, K_2=900 \quad (15)$$

$$M_1=1, N_1=48, K_1=12, q=36p_1=90, M_2=90, N_2=4320, K_2=1080 \quad (16)$$

$$M_1=1, N_1=48, K_1=16, q=32p_1=90, M_2=90, N_2=4320, K_2=1440 \quad (17)$$

$$M_1=1, N_1=48, K_1=24, q=24p_1=90, M_2=90, N_2=4320, K_2=2160 \quad (18)$$

$$M_1=1, N_1=48, K_1=30, q=18p_1=90, M_2=90, N_2=4320, K_2=2700 \quad (19)$$

$$M_1=1, N_1=48, K_1=32, q=16p_1=90, M_2=90, N_2=4320, K_2=2880 \quad (20)$$

TABLE 1

122 149 260 523 594 818 853 1222 1598 2064 2573 2773
167 279 861 866 955 991 1110 1505 1556 1651 2480 2681
454 957 1074 1118 1178 1472 1513 2275 2604 2740 3021 3244
85 343 356 449 672 702 771 1250 1428 1599 2917 3368
306 2384 3321
946 2217 2773
437 634 2654
250 3132 3349
311 2719 2862
866 1129 2661

Table 1 shows an example of a parity check matrix representing location information of rows with 1 in each 0-th column in a parity check matrix consisting of 10 column groups. {122, 149, ..., 2773} represent locations of rows with 1 in a 0-th column in a 0-th column group, {167, 279, ..., 2681} represent locations of rows with 1 in a 0-th column in a 1-st column, and {866, 1229, 2661} represent locations of rows with 1 in a 0-th column in a 9-th column. The parity check matrixes represented by Tables 2-41 below can also be construed in the same way.

TABLE 2

334 493 534 855 1051 1098 1372 1764 1833 2051 2103 3082
373 423 1050 1477 1515 1852 2071 2121 2291 2351 2925 3189
276 322 425 629 972 1407 1471 1953 1959 1985 2136 2648
38 54 114 280 314 930 1065 1616 1958 2256 2348 2892
325 1328 1409
1924 2648 2740
575 839 1322
506 1181 2401
235 1052 2695
1186 1966 2029
1490 1859 2098
979 1648 2969

TABLE 3

158 185 371 454 804 834 1019 1489 2188 2222 2326 2730
39 393 638 786 821 858 1346 1600 1879 2224 2348 2588
43 152 360 1062 1219 1524 1590 1839 1852 2093 2194 2336
292 394 837 944 1044 1121 1464 1754 1757 2143 2184 2830
205 233 243 433 515 1301 1309 1663 1691 2167 2315 2565
533 1734 2431
1224 2014 2679
537 1763 2288
100 146 683
310 2397 2599
1052 2503 2606
122 499 2029
468 1169 2306
1089 2383 2602
1688 1792 2284
251 1093 2729

TABLE 4

172 206 283 287 394 1053 1921 2048
177 386 766 948 1096 1303 1453 1795
395 447 593 742 1232 1254 1272 1322
804 976 1607 1632 1652 1899 1930 1974
625 663 670 812 945 1170 1397 1903
323 389 781 819 1009 1076 1745 2121
520 1020 1166 1179 1509 1565 1626 1735
1079 1814 2032
408 1282 1300
115 1023 1928
475 511 986
622 1354 1500
1200 1818 2029

TABLE 4-continued 141 1334 1588
1566 1645 1729
947 1280 1535
1563 1761 2105
105 245 1604
107 428 1144
845 1561 1650
597 1214 2075
1265 1735 2124
242 1038 1266
207 1774 1779

TABLE 5

38 54 134 137 313 467 734 933 959 1009 1191 1525
35 241 356 594 873 1047 1072 1149 1290 1334 1338 1480
242 271 489 820 880 999 1169 1257 1319 1560 1572 1577
754 801 877 914 940 947 998 1008 1032 1172 1283 1344
85 253 1348
337 1142 1548
680 1014 1288
359 747 1569
922 1082 1469
233 763 1193
141 542 1252
976 1272 1314
56 113 480
253 1066 1511
447 691 1129
311 975 1183
188 226 394
330 983 1096
172 919 1128
435 624 752
376 922 1341
260 357 901
659 802 936
273 610 691
251 1086 1345
26 616 770
707 789 1575
421 479 1459
378 585 1464
295 596 1256

TABLE 6

138 182 257 365 396 443 585 784 799 979 1109 1140 1159
40 318 411 469 711 781 866 881 998 1044 1168 1343 1369
63 100 108 142 146 401 554 717 807 873 1110 1363 1368
91 168 174 182 421 426 465 649 691 703 892 896 1058
49 116 392 462 683 800 930 935 997 1050 1228 1299 1325
848 1193 1221
238 250 627
140 465 552
189 416 1208
55 84 988
490 751 785
322 1191 1435
372 603 1070
566 1090 1132
761 927 1030
116 761 1041
1253 1357 1386
352 1155 1277
239 1415 1427
174 449 807
610 680 1358
831 965 1019
122 1152 1252
529 1158 1181
105 1091 1164
373 626 942
31 280 692
555 608 1254

TABLE 6-continued 744 949 1171
253 550 859
66 892 1354
25 375 1389

In accordance with another embodiment of the present invention, parity check matrixes $H_2$ and $H_3$ are efficiently generated by applying the method of FIG. 5 to a parity check matrix $H_1$ having parameters given in Equations (21) to (26) below, and the generated parity check matrixes $H_2$ and $H_3$ are represented in Tables 7 to 18.

$$M_1=1, N_1=48, K_1=10, q=38 p_1=30, M_2=30, N_2=1440,\\ K_2=300 p_2=3, M_3=90, N_3=4320, K_3=900 \quad (21)$$

$$M_1=1, N_1=48, K_1=12, q=36 p_1=30, M_2=30, N_2=1440,\\ K_2=360 p_2=3, M_3=90, N_3=4320, K_3=1080 \quad (22)$$

$$M_1=1, N_1=48, K_1=16, q=32 p_1=30, M_2=30, N_2=1440,\\ K_2=480 p_2=3, M_3=90, N_3=4320, K_3=1440 \quad (23)$$

$$M_1=1, N_1=48, K_1=24, q=24 p_1=30, M_2=30, N_2=1440,\\ K_2=720 p_2=3, M_3=90, N_3=4320, K_3=2160 \quad (24)$$

$$M_1=1, N_1=48, K_1=30, q=18 p_1=30, M_2=30, N_2=1440,\\ K_2=900 p_2=3, M_3=90, N_3=4320, K_3=2700 \quad (25)$$

$$M_1=1, N_1=48, K_1=32, q=16 p_1=30, M_2=30, N_2=1440,\\ K_2=960 p_2=90, M_3=90, N_3=4320, K_3=2880 \quad (26)$$

TABLE 7

149 366 511 523 564 683 762 818 844 924 956 977
200 251 319 334 347 511 545 606 991 1051 1110 1123
36 168 209 294 324 612 717 722 805 867 1040 1074
34 221 318 459 465 637 771 892 934 1052 1088 1103
40 194 357
13 113 566
374 437 634
250 765 814
439 1038 1109
217 866 989

TABLE 8

149 511 523 844 1823 2646 2844 3042 3098 3204 3236 3257
251 319 347 511 545 606 1123 1340 1474 2131 2191 2250
36 168 209 294 717 1074 1464 1752 1862 1945 3147 3320
318 465 637 771 892 934 1088 1103 1361 2314 2739 3332
40 1244 2637
1153 1253 1706
634 2654 2717
765 814 2530
1579 2249 3318
1357 2129 3146

TABLE 9

79 298 364 396 431 486 493 562 570 681 699 855
33 199 337 399 577 603 621 635 700 1019 1029 1050
60 178 272 360 391 435 585 732 785 845 879 905
80 96 114 254 314 388 414 464 590 930 993 1056
397 437 860
160 580 812
575 710 983
533 745 866
139 523 1016
106 157 922
226 446 1067
593 691 748

TABLE 10

298 364 431 699 1159 1566 1642 1761 2556 2653 2730 3015
337 700 1029 1113 1279 1683 2099 2130 2559 2737 2781 2795
60 272 360 905 1471 2338 2595 2745 2892 2945 3005 3039
254 930 1176 1468 1670 2136 2240 2274 2474 2574 2624 3153
437 860 1477
160 580 2972
2735 2870 3143
1613 1825 1946
1016 2299 2683
157 922 1186
446 2147 2386
691 748 1673

TABLE 11

76 83 130 158 185 246 302 337 422 746 804 891
28 82 162 474 638 752 821 832 876 905 919 935
88 114 173 214 259 416 427 436 591 678 700 872
97 120 223 232 426 532 558 676 794 925 933 944
81 333 341 349 459 515 553 613 703 795 855 883
159 181 806
23 94 424
368 451 665
114 612 811
295 477 662
860 878 903
45 314 371
273 386 468
33 399 778
344 812 832
69 571 777

TABLE 12

130 337 804 1043 1262 1706 1996 2078 2105 2166 2342 2811
474 638 821 832 876 919 988 1042 2082 2672 2825 2855
88 416 427 1133 1219 1396 2034 2134 2511 2598 2620 2792
426 558 925 1057 1183 1192 1492 1636 1893 2040 2714 2864
81 341 349 515 553 795 883 1815 2253 2379 2533 2623
159 806 1141
1384 1943 2014
451 1328 1625
114 1771 2532
662 1255 1437
903 1820 1838
45 2234 2291
273 1428 2306
33 399 2698
344 1772 1792
777 1029 1531

TABLE 13

4 115 121 254 359 394 488 501
22 177 253 319 376 451 530 580
198 275 305 351 358 384 602 632
36 68 119 123 178 216 256 318
164 183 225 241 430 509 522 679
53 233 289 347 469 548 681 699
21 186 197 252 439 459 520 542
23 302 496
72 220 490
115 392 471
475 535 602
516 526 538
13 162 480
141 148 350
61 150 241
95 395 536
123 657 665
116 197 345
160 203 428
193 221 642

TABLE 13-continued 83 230 621
199 228 545
18 342 698
111 286 675

TABLE 14

4 115 121 254 359 394 501 1208
22 177 530 973 1171 1759 1816 2020
198 275 305 351 358 384 602 1352
216 256 318 788 843 1476 1559 1618
430 679 903 961 1604 1665 1949 1962
53 233 681 1009 1189 1419 1787 1988
186 197 459 520 972 1461 1879 1982
23 1216 1742
220 792 1930
115 1191 1832
475 602 1975
516 1246 1258
1200 1453 1602
861 1070 1588
61 150 241
395 536 1535
843 2097 2105
116 917 1065
880 1148 1643
913 941 1362
950 1523 2061
545 919 1668
18 342 1418
111 675 1006

TABLE 15

20 55 61 95 107 120 170 255 266 342 389 483
33 58 73 135 162 179 187 190 214 294 463 489
16 45 125 141 155 170 185 348 416 442 505 518
86 108 149 172 188 322 371 384 390 436 506 517
58 84 124 140 147 205 236 276 279 396 496 499
133 342 515
23 246 377
165 446 478
13 220 434
42 332 464
164 357 426
252 279 382
110 171 240
140 148 451
224 353 501
93 294 497
169 354 430
52 257 265
387 408 523
179 369 399
238 286 388
55 205 303
216 229 336
260 453 484
302 383 443
43 202 485
136 150 339
121 368 523
190 216 491
269 506 512

TABLE 16

20 55 107 170 342 483 635 929 1141 1200 1335 1346
58 73 135 179 294 754 1029 1113 1242 1267 1270 1543
45 125 505 695 888 956 1096 1221 1250 1265 1522 1598
86 149 188 322 371 506 648 712 930 1057 1464 1516
58 84 140 147 279 396 745 1036 1039 1204 1316 1356
133 342 515

TABLE 16-continued 377 786 1103
986 1018 1245
553 760 1514
464 582 872
357 426 1244
792 819 922
171 240 1190
140 451 688
353 1304 1581
93 497 834
430 1249 1434
257 592 805
408 1063 1467
399 1259 1449
1318 1366 1468
303 595 745
1296 1309 1416
453 800 1564
302 983 1463
583 742 1025
690 879 1216
661 908 1063
1270 1296 1571
506 512 809

TABLE 17

0 17 58 61 119 156 179 182 265 277 308 319 443
38 66 84 149 263 269 318 344 368 383 395 401 425
100 103 108 114 118 142 159 218 296 393 401 403 413
42 82 174 182 187 211 288 296 313 341 385 431 476
4 42 49 60 131 203 245 253 320 334 408 450 455
213 233 368
19 346 366
152 460 465
416 440 445
7 28 148
305 335 362
39 434 459
11 430 452
108 246 418
15 230 297
81 313 436
154 189 261
192 243 301
71 143 339
247 350 449
34 174 360
59 133 335
148 192 346
49 205 406
41 83 220
53 62 146
31 260 344
75 128 166
120 211 389
123 294 349
66 314 444
167 377 429

TABLE 18

17 119 179 182 319 480 538 745 788 1021 1116 1237 1403
263 318 564 629 749 824 848 863 875 905 998 1026 1361
108 401 413 583 598 622 698 776 883 1060 1074 1119 1353
82 174 211 296 313 341 385 476 662 667 768 911 1002
42 60 408 450 455 484 725 733 800 814 1009 1091 1163
213 713 1328
19 346 846
465 940 1112
445 896 920
148 967 988
1265 1295 1322
519 1394 1419

TABLE 18-continued 430 452 971
588 726 898
15 710 1257
81 313 1396
261 634 1149
301 1152 1203
71 1103 1299
449 830 1207
360 514 654
133 335 539
672 1108 1306
205 406 1009
41 563 1180
1013 1022 1106
31 260 1304
75 166 608
120 211 869
603 1254 1309
66 1274 1404
167 909 1337

In accordance with another embodiment of the present invention, parity check matrixes $H_2$ and $H_3$ are efficiently generated by applying the method of FIG. 5 to a parity check matrix $H_1$ having parameters given in Equations (27) to (31) below, and the generated parity check matrixes $H_2$ and $H_3$ are represented in Tables 19 to 28.

$$M_1=1, N_1=48, K_1=9, q=39 p_1=30, M_2=30, N_2=1440,$$
$$K_2=270 p_2=3, M_3=90, N_3=4320, K_3=810 \quad (27)$$

$$M_1=1, N_1=48, K_1=16, q=32 p_1=30, M_2=30, N_2=1440,$$
$$K_2=480 p_2=3, M_3=90, N_3=4320, K_3=1440 \quad (28)$$

$$M_1=1, N_1=48, K_1=21, q=27 p_1=30, M_2=30, N_2=1440,$$
$$K_2=630 p_2=3, M_3=90, N_3=4320, K_3=1890 \quad (29)$$

$$M_1=1, N_1=48, K_1=28, q=20 p_1=30, M_2=30, N_2=1440,$$
$$K_2=840 p_2=3, M_3=90, N_3=4320, K_3=2520 \quad (30)$$

$$M_1=1, N_1=48, K_1=32, q=16 p_1=30, M_2=30, N_2=1440,$$
$$K_2=960 p_2=3, M_3=90, N_3=4320, K_3=2880 \quad (31)$$

TABLE 19

41 63 144 204 271 402 440 525 561 620 718 733 980 1037 1042 1138
82 107 223 338 447 451 598 625 644 712 766 945 1016 1122 1125 1162
21 102 266 389 409 425 646 668 676 781 872 897 983 1047 1108 1137
81 112 259 410 426 456 628 692 748 797 812 973 989 1064 1074 1091
471 884 951
123 190 1154
324 420 1150
78 244 329
457 476 816

TABLE 20

41 63 440 525 980 1042 1441 1731 1888 1903 2308 2484 2544 2742 2960 3377
766 1122 1125 1162 1252 1277 1508 1617 1795 1814 2186 2563 2791 2938 3052 3285
425 646 668 872 897 1191 1272 1436 1579 1951 2153 2217 2729 3016 3448 3477
81 259 426 628 748 1626 1862 2261 2452 2750 3137 3152 3313 3329 3404 3414
884 2811 3291
190 1154 1293
324 420 1150
78 1499 2584
476 1627 1986

TABLE 21

120 125 172 227 267 316 411 467 542 608 737 741 749 825 871 884
82 228 250 287 296 369 418 425 432 469 503 646 751 842 854 878
198 204 263 278 286 370 416 440 474 508 528 596 607 665 682 776
35 55 59 101 239 369 521 526 541 577 612 661 674 811 819 909
35 242 874
83 113 636
93 271 832
385 537 831
26 150 773
647 695 725
792 877 902
236 302 699
94 192 777
112 260 385
244 639 802
61 363 712

TABLE 22

267 316 608 737 884 1080 1085 1132 1187 1371 1502 1709 2387 2661 2745 2791
82 287 425 469 1188 1210 1378 1392 1711 1814 1838 2216 2289 2423 2566 2762
278 286 440 474 508 528 776 1223 1330 1556 1567 1625 2118 2124 2336 2602
55 101 239 521 612 674 811 1329 1486 1501 1537 1621 1779 1955 1979 2829
35 242 874
1043 1596 2033
832 1231 2013
537 2305 2751
26 150 2693
647 725 2615
2712 2797 2822
236 699 2222
1054 1152 2697
1072 1220 2305
639 802 2164
61 1323 2632

TABLE 23

55 64 140 180 204 269 330 426 430 441 448 513 516 521 535 564 661 749
9 52 85 102 251 314 358 363 380 473 590 672 697 712 722 728 740 802
13 129 142 193 213 252 317 325 330 351 386 454 538 555 613 758 772 794
64 93 103 138 178 206 212 241 404 446 505 585 653 702 738 760 769 785
14 50 91 113 126 146 210 258 282 287 325 344 493 519 566 656 672 759
324 628 653
186 552 624
106 330 581
58 107 715
27 169 366
195 463 797
565 593 780
83 450 467
171 530 609
217 659 751
104 340 613
289 416 651
336 680 715
71 509 676
369 691 785
91 129 479

TABLE 24

64 140 180 204 330 535 661 865 1079 1251 1323 1326 1331 1374 2046 2050 2068 2369
380 473 712 819 862 1061 1124 1168 1173 1507 1538 1550 1612 1705 1722 2210 2292 2342
129 213 317 351 386 454 538 613 772 794 952 1062 1568 1633 1813 1945 1950 2175
93 138 212 241 653 760 769 913 1016 1214 1512 1548 1595 1684 1798 2066 2125 2205
113 126 210 282 287 519 672 759 824 1303 1376 1670 1711 1766 1878 1945 1964 2276
653 1438 1944
186 2172 2244
106 1950 2201
1525 1678 1727
27 1789 1986
1273 1607 1815
593 1375 1590
1260 1703 2087
530 609 981
1027 1469 2371
914 1150 2233
289 1226 2271
1525 1956 2300
881 1486 2129
369 2311 2405
1711 1749 2099

TABLE 25

1 48 50 57 149 151 179 192 200 214 226 303 313 398 465 495 502 567
6 99 122 149 170 208 213 264 276 341 363 367 378 391 477 535 565 574
66 80 152 184 208 314 321 325 357 389 393 430 443 487 518 551 556 599
90 99 145 207 222 226 244 295 351 360 373 408 418 483 492 516 529 537
38 60 150 208 261 263 324 331 366 392 407 415 489 516 534 542 557 585
29 75 92 113 138 186 240 251 270 282 301 316 339 384 488 494 567 585
135 401 447
388 457 562
18 90 245
306 314 559
61 203 494
13 62 95
12 100 397
176 324 459
348 433 501
76 84 589
191 199 407
257 370 482
260 371 476
72 149 204
13 240 523
245 456 527
132 158 184
226 419 457
143 289 395
108 160 452
310 326 458
131 174 325

TABLE 26

192 214 313 398 567 650 826 1065 1201 1248 1257 1349 1351 1379 1400 1503 1695 1702
149 208 264 276 391 574 967 1077 1206 1299 1322 1370 1413 1541 1563 1578 1735 1765
66 80 152 184 357 518 556 921 925 1043 1408 1514 1589 1593 1630 1687 1751 1799
90 222 226 244 351 483 529 537 699 807 895 960 1008 1018 1116 1345 1573 1692
38 208 366 392 489 516 534 557 750 861 931 1007 1015 1185 1260 1463 1524 1742
29 92 270 282 339 494 567 585 713 901 1275 1338 1386 1440 1451 1516 1584 1688
135 1001 1647
457 988 1162
18 90 245
306 914 1759
803 1261 1694
13 662 1295
12 100 397
459 776 1524
348 501 1033
676 1284 1789

TABLE 26-continued 191 407 1399
857 970 1682
260 971 1676
149 804 1272
1213 1440 1723
245 1056 1127
132 158 1384
457 826 1019
395 743 889
760 1052 1308
458 910 926
325 774 1331

TABLE 27

40 98 117 173 195 198 224 235 260 279 313 319 337 394 398 476
11 54 111 149 258 273 288 314 339 344 359 365 414 436 441 460
29 47 49 153 174 181 195 268 315 344 386 404 407 410 422 464
29 34 38 62 72 92 128 165 201 211 247 271 378 395 436 465
3 70 101 103 138 159 201 226 253 268 280 305 308 318 411 416
10 28 36 47 81 83 105 128 214 219 226 231 334 365 405 440
151 304 412
221 450 472
59 78 117
192 212 477
30 99 465
166 175 251
0 259 427
9 93 372
40 389 479
28 193 391
101 167 370
132 360 390
188 256 435
126 379 385
57 241 451
52 248 429
15 197 231
210 326 346
229 400 478
71 139 162
172 218 479
169 344 445
44 166 306
110 435 442
97 102 426
121 340 479

TABLE 28

117 224 235 313 319 337 394 520 653 956 1058 1155 1158 1220 1239 1358
11 111 339 359 436 753 768 824 1014 1109 1218 1274 1325 1374 1401 1420
153 174 661 866 902 944 989 1007 1009 1155 1228 1275 1304 1364 1367 1370
62 128 211 378 465 509 572 645 916 994 998 1032 1161 1207 1231 1355
70 226 253 305 308 318 411 483 581 618 748 896 1063 1119 1161 1240
10 28 219 365 405 440 516 527 561 563 706 711 1065 1088 1174 1294
304 892 1111
221 450 472
78 539 597
212 477 1152
30 945 1059
166 175 1211
259 907 960
372 489 1053
389 520 959
988 1153 1351
167 850 1061
360 612 1350
256 668 1395
606 859 1345
451 721 1017
909 1012 1208
495 711 1157
210 806 1306
400 478 709

TABLE 28-continued 71 139 1122
479 1132 1178
169 344 925
44 166 306
110 442 1395
1057 1062 1386
121 479 1300

In accordance with another embodiment of the present invention, a parity check matrix $H_2$ is efficiently generated by applying the method of FIG. 5 to a parity check matrix $H_1$ having parameters given in Equations (32) to (35) below, and the generated parity check matrix $H_2$ is represented in Tables 29 to 32.

$$M_1=1, N_1=48, K_1=16, q=32 p_1=90, M_2=90, N_2=4320, K_2=1440 \quad (32)$$

$$M_1=1, N_1=48, K_1=16, q=27 p_1=90, M_2=90, N_2=4320, K_2=1890 \quad (33)$$

$$M_1=1, N_1=48, K_1=28, q=20 p_1=90, M_2=90, N_2=4320, K_2=2520 \quad (34)$$

$$M_1=1, N_1=48, K_1=32, q=16 p_1=90, M_2=90, N_2=4320, K_2=2880 \quad (35)$$

TABLE 29

35 242 874
1043 1596 2033
267 316 608 737 884 1080 1085 1132 1187 1371 1502 1709 2387 2661 2745 2791
82 287 425 469 1188 1210 1378 1392 1711 1814 1838 2216 2289 2423 2566 2762
278 286 440 474 508 528 776 1223 1330 1556 1567 1625 2118 2124 2336 2602
55 101 239 521 612 674 811 1329 1486 1501 1537 1621 1779 1955 1979 2829
832 1231 2013
537 2305 2751
26 150 2693
647 725 2615
2712 2797 2822
236 699 2222
1054 1152 2697
1072 1220 2305
639 802 2164
61 1323 2632

TABLE 30

653 1438 1944
186 2172 2244
106 1950 2201
1525 1678 1727
64 140 180 204 330 535 661 865 1079 1251 1323 1326 1331 1374 2046 2050 2068 2369
380 473 712 819 862 1061 1124 1168 1173 1507 1538 1550 1612 1705 1722 2210 2292 2342
27 1789 1986
1273 1607 1815
129 213 317 351 386 454 538 613 772 794 952 1062 1568 1633 1813 1945 1950 2175
93 138 212 241 653 760 769 913 1016 1214 1512 1548 1595 1684 1798 2066 2125 2205
113 126 210 282 287 519 672 759 824 1303 1376 1678 1711 1766 1878 1945 1964 2276
593 1375 1590
1260 1703 2087
530 609 981
1027 1469 2371
914 1150 2233
289 1226 2271
1525 1956 2300
881 1486 2129
369 2311 2405
1711 1749 2099

TABLE 31

```
135 1001 1647
457 988 1162
18 90 245
306 914 1759
803 1261 1694
13 662 1295
12 100 397
459 776 1524
348 501 1033
676 1284 1789
191 407 1399
857 970 1682
260 971 1676
149 804 1272
192 214 313 398 567 650 826 1065 1201 1248 1257 1349 1351 1379 1400 1503 1695 1702
149 208 264 276 391 574 967 1077 1206 1299 1322 1370 1413 1541 1563 1578 1735 1765
66 80 152 184 357 518 556 921 925 1043 1408 1514 1589 1593 1630 1687 1751 1799
90 222 226 244 351 483 529 537 699 807 895 960 1008 1018 1116 1345 1573 1692
38 208 366 392 489 516 534 557 750 861 931 1007 1015 1185 1260 1463 1524 1742
29 92 270 282 339 494 567 585 713 901 1275 1338 1386 1440 1451 1516 1584 1688
1213 1440 1723
245 1056 1127
132 158 1384
457 826 1019
395 743 889
760 1052 1308
458 910 926
325 774 1331
```

TABLE 32

```
304 892 1111
221 450 472
78 539 597
117 224 235 313 319 337 394 520 653 956 1058 1155 1158 1220 1239 1358
11 111 339 359 436 753 768 824 1014 1109 1218 1274 1325 1374 1401 1420
153 174 661 866 902 944 989 1007 1009 1155 1228 1275 1304 1364 1367 1370
62 128 211 378 465 509 572 645 916 994 998 1032 1161 1207 1231 1355
70 226 253 305 308 318 411 483 581 618 748 896 1063 1119 1161 1240
10 28 219 365 405 440 516 527 561 563 706 711 1065 1088 1174 1294
212 477 1152
30 945 1059
166 175 1211
259 907 960
372 489 1053
389 520 959
988 1153 1351
167 850 1061
360 612 1350
256 668 1395
606 859 1345
451 721 1017
909 1012 1208
495 711 1157
210 806 1306
400 478 709
71 139 1122
479 1132 1178
169 344 925
44 166 306
110 442 1395
1057 1062 1386
121 479 1300
```

In accordance with another embodiment of the present invention, a parity check matrix $H_2$ is efficiently generated by applying the method of FIG. 5 to a parity check matrix $H_1$ having parameters given in Equations (36) to (40) below, and the generated parity check matrix $H_2$ is represented in Tables 33 to 37.

$$M_1=1, N_1=48, K_1=9, q=39 p_1=90, M_2=90, N_2=4320, K_2=810 \quad (36)$$

$$M_1=1, N_1=48, K_1=16, q=32 p_1=90, M_2=90, N_2=4320, K_2=1440 \quad (37)$$

$$M_1=1, N_1=48, K_1=21, q=27 p_1=90, M_2=90, N_2=4320, K_2=1890 \quad (38)$$

$$M_1=1, N_1=48, K_1=28, q=20 p_1=90, M_2=90, N_2=4320, K_2=2520 \quad (39)$$

$$M_1=1, N_1=48, K_1=32, q=16 p_1=90, M_2=90, N_2=4320, K_2=2880 \quad (40)$$

TABLE 33

16 642 1168 1565 2133 2420 2531 2659 2745 2917 2934 3182 3405
181 187 238 301 1153 1578 1882 2009 2097 2536 2607 2704 2834
16 591 1788 1877 1919 1963 1969 2024 2050 2185 2549 2637 3276
14 294 506 826 853 1343 1429 1587 1914 2000 2298 2489 2759
1173 2561 3447
591 1048 2324
19 1065 1317
17 1648 2613
1159 1373 2883

TABLE 34

23 452 2193
25 916 1672
118 243 485 893 1016 1098 1155 1288 1434 1600 1777 2063 2668
5 13 510 1242 1792 2167 2233 2346 2389 2448 2530 2727 2812
386 390 688 1067 1176 1439 1619 1877 2203 2290 2340 2728 2734
387 651 916 1037 1087 1181 1321 1391 1431 1447 1970 2689 2779
17 25 198 288 364 660 878 996 1473 2044 2302 2390 2633
14 802 2141
12 1363 1786
1312 1750 2727
312 368 841
22 269 1471
18 97 133
143 1515 1630
28 803 1077
27 330 934

TABLE 35

7 1134 2300
510 678 2307
6 25 1175
26 1228 1576
54 69 884 1078 1260 1383 1679 1771 1918 2092 2101 2115 2190
104 112 523 821 1007 1838 1963 2113 2204 2226 2238 2255 2424
0 250 1014
365 1030 1464
224 291 394 517 576 607 794 924 973 1207 1240 1271 1426
4 9 323 367 666 878 941 1018 1102 1380 1566 1794 2254
1 26 152 338 465 686 739 1103 1235 1411 1770 1787 2346
26 51 727
8 720 2324
9 1502 2364
22 1790 1847
23 448 1180
3 11 20
13 896 1956
1324 2015 2156
21 758 1071
739 1884 1910

TABLE 36

415 1261 1287
57 662 1648
5 1630 1678
19 94 1586
1 1083 1634
242 1053 1715
97 1165 1672
16 164 519
1173 1288 1380
286 389 696
11 407 778
17 743 1470
1376 1451 1640
9 284 1472
90 98 347 434 839 849 933 942 1168 1352 1720 1761 1783
5 230 362 494 611 657 703 827 1053 1075 1129 1581 1624
4 46 78 133 214 336 348 431 597 1021 1479 1732 1769
5 84 111 329 555 679 758 816 986 1117 1223 1270 1520

TABLE 36-continued 5 17 250 275 443 741 756 888 902 940 1252 1387 1606
0 2 5 11 15 19 373 527 934 1164 1178 1488 1746
3 440 1173
545 827 916
12 1324 1578
17 599 766
9 362 575
12 761 1008
10 726 1118
5 1274 1551

TABLE 37

7 428 688
125 824 1090
37 1022 1211
95 226 407 491 505 513 637 670 698 805 1288 1347 1428
9 32 150 218 245 280 331 436 943 1148 1155 1214 1426
48 139 150 213 487 531 609 682 713 767 860 1188 1277
59 263 333 666 782 1110 1136 1157 1250 1252 1352 1377 1436
5 63 118 172 315 936 951 1104 1193 1294 1298 1379 1405
4 10 179 354 441 486 492 719 791 992 1009 1246 1373
1012 1088 1373
163 414 465
79 859 1110
11 176 611
381 852 1177
8 709 991
7 49 156
7 101 642
8 180 470
1068 1360 1411
11 1089 1118
9 675 1169
8 269 1364
7 1061 1327
6 858 1218
0 517 622
11 583 1026
362 940 1375
8 861 905
6 444 866
638 819 1018
22 1050 1137
4 9 159

In accordance with another embodiment of the present invention, a parity check matrix $H_2$ is efficiently generated by applying the method of FIG. 5 to a parity check matrix $H_1$ having parameters given in Equations (41) to (44) below, and the generated parity check matrix $H_2$ is represented in Tables 38 to 41.

$$M_1=1, N_1=60, K_1=12, q=48p_1=72, M_2=72, N_2=4320, K_2=864 \qquad (41)$$

$$M_1=1, N_1=60, K_1=15, q=45p_1=72, M_2=72, N_2=4320, K_2=1080 \qquad (42)$$

$$M_1=1, N_1=60, K_1=20, q=40p_1=72, M_2=72, N_2=4320, K_2=1440 \qquad (43)$$

$$M_1=1, N_1=60, K_1=25, q=35p_1=72, M_2=72, N_2=4320, K_2=1800 \qquad (44)$$

TABLE 38

384 944 1269 2266
407 1907 2268 2594
1047 1176 1742 1779
304 890 1817 2645
102 316 353 2250
488 811 1662 2323
31 2397 2468 3321

TABLE 38-continued 102 514 828 1010 1024 1663 1737 1870 2154 2390 2523 2759 3380
216 383 679 938 970 975 1668 2212 2300 2381 2413 2754 2997
536 889 993 1395 1603 1691 2078 2344 2545 2741 3157 3334 3377
694 1115 1167 2548
1266 1993 3229 3415

TABLE 39

1343 1563 2745 3039
1020 1147 1792 2609
2273 2320 2774 2976
665 2539 2669 3010
581 1178 1922 2998
633 2559 2869 2907
876 1213 2191 2261
916 1217 1632 2798
500 992 1230 2630
1842 2038 2169 2312
595 679 1206 1486
1087 2681 2894 3123
73 185 355 1381 1672 1998 2406 2577 2600 2834 3084 3115 3150
22 65 390 1022 1046 1465 1498 1682 1879 2108 2164 2203 3106
127 213 714 816 1031 1456 1815 2097 2183 2404 2934 2999 3153

TABLE 40

22 451 529 665 1424 1566 1843 1897 1940 2069 2334 2760 2833
287 303 321 644 874 1110 1132 1175 1266 1377 1610 1819 2517
58 183 247 821 965 1315 1558 1802 1969 2013 2095 2271 2627
181 285 1171 1208 1239 1468 1956 1992 2083 2253 2456 2664 2859
209 1067 1240 2698
970 1201 2099 2388
211 1820 2602 2630
471 1101 1972 2244
254 793 2546 2680
147 761 1495 2794
75 1108 2256 2842
178 796 1309 1763
1820 2157 2470 2686
998 1502 1728 2431
1385 1432 1919 2730
244 972 1673 1902
583 1333 1645 2675
316 664 1086 2854
776 997 2287 2825
537 1719 1746 2728

TABLE 41

103 134 272 282 763 1086 1107 1599 1797 1904 2047 2281 2398
8 232 419 579 676 1333 1486 1710 1777 2079 2193 2377 2415
147 268 335 726 1260 1536 1654 1879 1975 2086 2187 2314 2378
5 450 726 833 860 1200 1425 1507 1512 1588 1921 2029 2504
841 1428 1909 2157
1173 1467 1744 2137
253 618 2173 2309
1163 1518 1836 2425
1276 1563 1646 2320
140 799 847 1306
49 1249 1364 1663
38 509 517 1816
677 761 1544 1842
798 1021 1728 1911
160 772 1325 2465
146 1214 1241 1700
608 672 2082 2506
648 1514 1777 2489
82 415 1755 2196
1096 2140 2149 2475
278 1030 1051 2285
66 1439 2345 2391
251 1683 2252 2494
130 260 428 1328
767 1335 1374 2152

Figure 11:
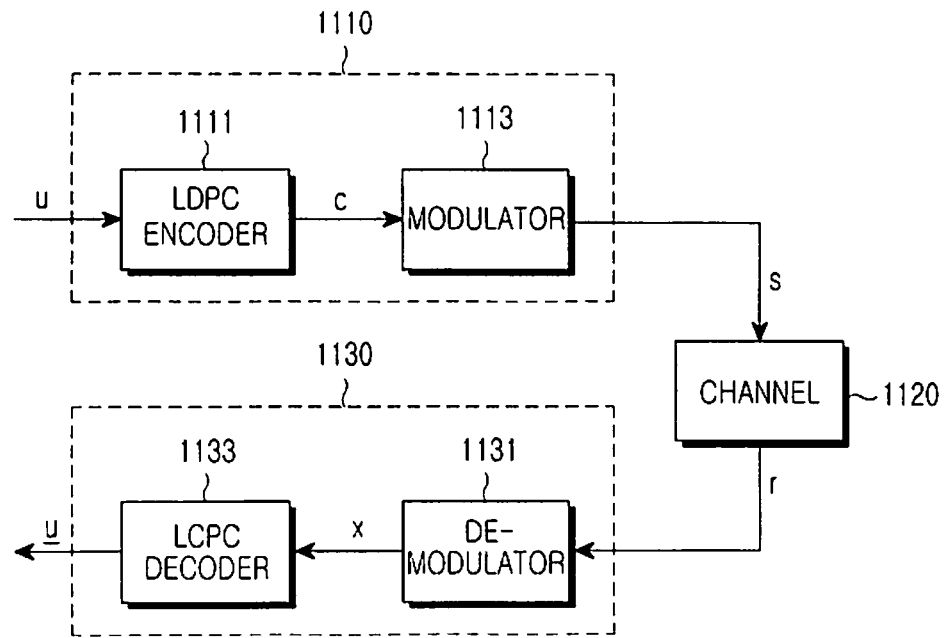
FIG. 11 is a block diagram illustrating a structure of a communication system using linear block codes according to an embodiment of the present invention.

FIG. 11 is a block diagram illustrating a structure of a communication system using linear block codes according to an embodiment of the present invention.

Referring to FIG. 11, a message u is encoded in a transmitter 1110 by an LDPC encoder 1111, which outputs a signal c. The output signal c is modulated by a modulator 1113, which outputs a signal s that is transmitted over a wireless channel 1120. In a receiver 1130, a demodulator 1131 demodulates a signal r received through the channel 1120, and outputs a demodulated signal x. The LDPC decoder 1133 extracts an estimate u of the message from the demodulated signal x.

The LDPC encoder 1111 and the LDPC decoder 1133 select a parity check matrix according to a block length required by the communication system, and perform encoding and decoding thereon using a predetermined encoding/decoding scheme. Particularly, in accordance with an embodiment of the present invention, the LDPC encoder 1111 and the LDPC decoder 1133 support various block lengths in an LDPC code by generating a parity check matrix of a large-sized LDPC code from a parity check matrix of a small-sized LDPC code or by generating a parity check matrix of a small-sized LDPC code from a parity check matrix of a large-sized LDPC code, or may support various block lengths using a parity check matrix of an LDPC code having the longest block length, without separately storing parity check matrixes of LDPC codes having different block lengths.

Figure 12:
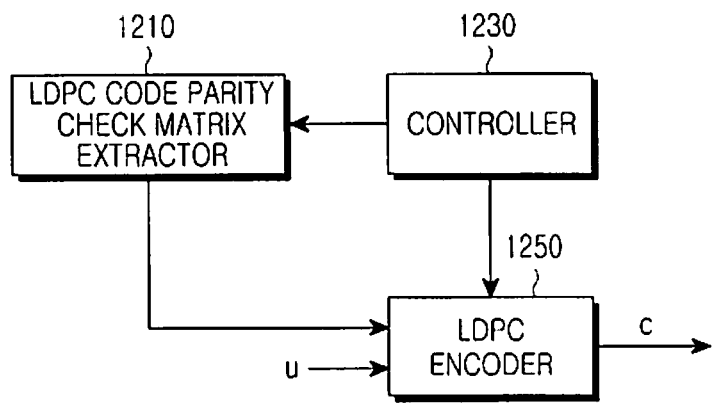
FIG. 12 is a block diagram of a transmission apparatus using linear block codes according to an embodiment of the present invention.

FIG. 12 is a block diagram illustrating a transmission apparatus using an LDPC code generated according to an embodiment of the present invention.

The transmission apparatus includes an LDPC code parity check matrix extractor 1210, a controller 1230, and an LDPC encoder 1250.

The LDPC code parity check matrix extractor 1210 extracts an LDPC code parity check matrix according to system requirements. The LDPC code parity check matrix may be extracted from the sequence information finally obtained by the method illustrated in FIG. 5, using Equation (10) or (11), may be extracted from a memory storing the parity check matrix, may be given in the transmission apparatus, or may be generated in the transmission apparatus.

The controller 1230 determines a required parity check matrix according to a codeword length or an information word length to meet the system requirements. Accordingly, the controller 1230 may include the LDPC code parity check matrix extractor 1210.

The LDPC encoder 1250 performs encoding based on information about the LDPC code parity check matrix, called by the controller 1230 and the LDPC code parity check matrix extractor 1210.

Figure 13:
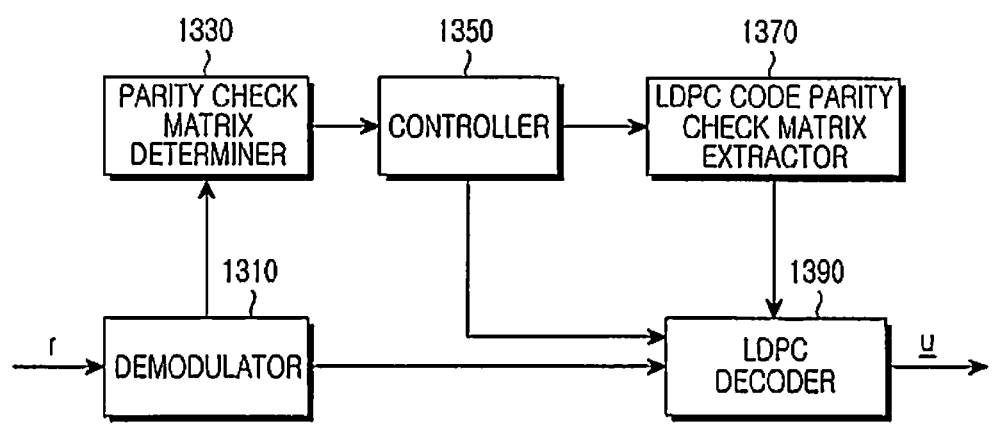
FIG. 13 is a block diagram illustrating a reception apparatus using linear block codes according to an embodiment of the present invention.

FIG. 13 is a block diagram illustrating a reception apparatus according to an embodiment of the present invention. Specifically, the reception apparatus illustrated in FIG. 13 receives a signal transmitted by a communication system using the designed LDPC code, and restores user desired data from the received signal.

The reception apparatus includes a demodulator 1310, a parity check matrix determiner 1330, a controller 1350, an LDPC code parity check matrix extractor 1370, and an LDPC decoder 1390.

The demodulator 1310 receives and demodulates an LDPC code, and transfers the demodulated signal to the parity check matrix determiner 1330 and the LDPC decoder 1390.

The parity check matrix determiner 1330, under control of the controller 1350, determines a parity check matrix of an LDPC code used in the system, from the demodulated signal.

The controller 1350 transfers the determination made by the parity check matrix determiner 1330 to the LDPC code parity check matrix extractor 1370 and the LDPC decoder 1390.

The LDPC code parity check matrix extractor 1370, under control of the controller 1350, extracts a parity check matrix of an LDPC code required by the system and transfers the extracted parity check matrix to the LDPC decoder 1390. Alternatively, the controller 1350 may include at least one of the parity check matrix determiner 1330 and the LDPC code parity check matrix extractor 1370. The LDPC code parity check matrix may be extracted from the sequence information finally obtained by the method of FIG. 5, using Equation (10) or (11), may be extracted from a memory storing the parity check matrix, may be given in the reception apparatus, or may be generated in the reception apparatus.

The LDPC decoder 1390, under control of the controller 1350, performs decoding based on the received signal transferred from the demodulator 1310 and information about the LDPC code parity check matrix transferred from the LDPC code parity check matrix extractor 1370.

Figure 14:
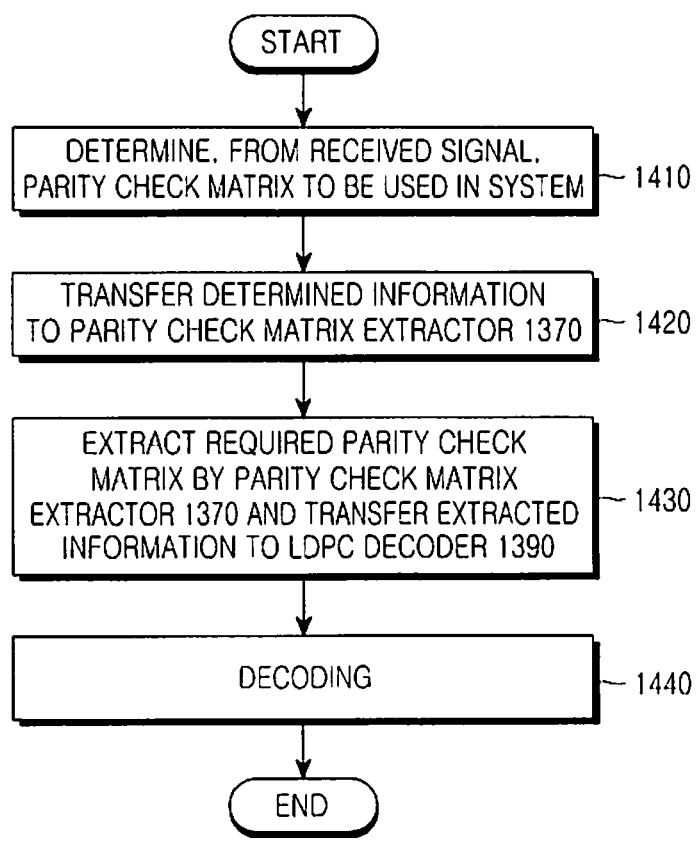
FIG. 14 is a flow diagram illustrating a reception operation in a reception apparatus using linear block codes according to an embodiment of the present invention.

FIG. 14 illustrates a decoding operation of a reception apparatus according to an embodiment of the present invention.

In step 1410, the parity check matrix determiner 1330 determines, from a received signal, a parity check matrix of an LDPC code used in the system. In step 1420, the controller 1350 transfers information about the parity check matrix of the LDPC code to the LDPC code parity check matrix extractor 1370 and the LDPC decoder 1390, as a result of the determination made by the parity check matrix determiner 1330. In step 1430, the LDPC code parity check matrix extractor 1370 extracts a parity check matrix of the LDPC code required in the system, and delivers it to the LDPC decoder 1390. In step 1440, the LDPC decoder 1390 decodes the received parity check matrix of the LDPC code.

While the examples of FIGS. 11 to 14 have been described in connection with LDPC codes, by way of example, the above-described structure and operation of the transmission/reception apparatus may be applied in the same way not only to the LDPC code but also to other linear block codes using a parity check matrix.

As is apparent from the foregoing description, according to the above-described embodiments of the present invention, a parity check matrix of a linear block code having a very long codeword length can be efficiently designed from a small-sized parity check matrix while maintaining suboptimized cycle characteristics on a Tanner graph.

In addition, the present invention can generate linear block codes having various block lengths using information about a parity check matrix given in a communication system using linear block codes. Because linear block codes having various block lengths can be supported from one parity check matrix, parity check matrix information can be efficiently stored, facilitating system expansion.

While the present invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A method for encoding a channel in a communication system using a Low-Density Parity Check (LDPC) code, the method comprising the steps of:
   extracting a parity-check matrix of the LDPC code; and
   performing LDPC encoding using the extracted parity-check matrix,
   wherein a code rate is 1/5, a length of a codeword is 4320, and the parity-check matrix is formed as defined in the following table:

384 944 1269 2266
   407 1907 2268 2594
   1047 1176 1742 1779
   304 890 1817 2645
   102 316 353 2250
   488 811 1662 2323
   31 2397 2468 3321
   102 514 828 1010 1024 1663 1737 1870 2154 2390 2523 2759 3380
   216 383 679 938 970 975 1668 2212 2300 2381 2413 2754 2997
   536 889 993 1395 1603 1691 2078 2344 2545 2741 3157 3334 3377
   694 1115 1167 2548
   1266 1993 3229 3415

2. The method of claim 1, wherein the parity-check matrix has a plurality of column groups provided by grouping columns corresponding to an information word, and each column group has 72 columns, and
   wherein each row in the table includes sequence information indicating positions of rows where '1' is located in a corresponding column group of the parity-check matrix.

3. The method of claim 1, wherein the code rate denotes a ratio of a length of an information word to a length of a codeword, respectively, corresponding to the parity-check matrix.

4. A method for decoding a channel in a communication system using a Low-Density Parity Check (LDPC) code, the method comprising the steps of:
   extracting a parity-check matrix of the LDPC code; and
   performing LDPC decoding using the extracted parity-check matrix,
   wherein a code rate is 1/5, a length of a codeword is 4320, and the parity-check matrix is formed as defined in the following table:

384 944 1269 2266
   407 1907 2268 2594
   1047 1176 1742 1779
   304 890 1817 2645
   102 316 353 2250
   488 811 1662 2323
   31 2397 2468 3321
   102 514 828 1010 1024 1663 1737 1870 2154 2390 2523 2759 3380
   216 383 679 938 970 975 1668 2212 2300 2381 2413 2754 2997
   536 889 993 1395 1603 1691 2078 2344 2545 2741 3157 3334 3377
   694 1115 1167 2548
   1266 1993 3229 3415

5. The method of claim 4, wherein the parity-check matrix has a plurality of column groups provided by grouping columns corresponding to an information word, and each column group has 72 columns, and
   wherein each row in the table includes sequence information indicating positions of rows where '1' is located in a corresponding column group of the parity-check matrix.

6. The method of claim 4, wherein the code rate denotes a ratio of a length of an information word to a length of a codeword, respectively, corresponding to the parity-check matrix.

7. An apparatus for encoding a channel in a communication system using a Low-Density Parity Check (LDPC) code, the apparatus comprising:
   a controller for extracting a parity-check matrix of the LDPC code from a memory; and an encoder for performing LDPC encoding using the extracted parity-check matrix, wherein a code rate is 1/5, a length of a codeword is 4320, and the parity-check matrix is formed as defined in the following table:

384 944 1269 2266
407 1907 2268 2594
1047 1176 1742 1779
304 890 1817 2645
102 316 353 2250
488 811 1662 2323
31 2397 2468 3321
102 514 828 1010 1024 1663 1737 1870 2154 2390 2523 2759 3380
216 383 679 938 970 975 1668 2212 2300 2381 2413 2754 2997
536 889 993 1395 1603 1691 2078 2344 2545 2741 3157 3334 3377
694 1115 1167 2548
1266 1993 3229 3415

8. The apparatus of claim 7, wherein the parity-check matrix has a plurality of column groups provided by grouping columns corresponding to an information word, and each column group has 72 columns, and wherein each row in the table includes sequence information indicating positions of rows where '1' is located in a corresponding column group of the parity-check matrix.

9. The apparatus of claim 7, wherein the code rate denotes a ratio of a length of an information word to a length of a codeword, respectively, corresponding to the parity-check matrix.

10. An apparatus for decoding a channel in a communication system using a Low-Density Parity Check (LDPC) code, comprising:

a controller for extracting a parity-check matrix of the LDPC code from a memory; and a decoder for performing LDPC decoding using the extracted parity-check matrix, wherein a code rate is 1/5, a length of a codeword is 4320, and the parity-check matrix is formed as defined in the following table:

384 944 1269 2266
407 1907 2268 2594
1047 1176 1742 1779
304 890 1817 2645
102 316 353 2250
488 811 1662 2323
31 2397 2468 3321
102 514 828 1010 1024 1663 1737 1870 2154 2390 2523 2759 3380
216 383 679 938 970 975 1668 2212 2300 2381 2413 2754 2997
536 889 993 1395 1603 1691 2078 2344 2545 2741 3157 3334 3377
694 1115 1167 2548
1266 1993 3229 3415

11. The apparatus of claim 10, wherein the parity-check matrix has a plurality of column groups provided by grouping columns corresponding to an information word, and each column group has 72 columns, and wherein each row in the table includes sequence information indicating positions of rows where '1' is located in a corresponding column group of the parity-check matrix.

12. The apparatus of claim 10, wherein the code rate denotes a ratio of a length of an information word to a length of a codeword, respectively, corresponding to the parity-check matrix.

* * * * *